(12) United States Patent
Park et al.

(10) Patent No.: US 8,525,247 B2
(45) Date of Patent: Sep. 3, 2013

(54) NON-VOLATILE MEMORY DEVICE HAVING VARIABLE RESISTANCE ELEMENT

(75) Inventors: Chan-Jin Park, Yongin-si (KR);
Hyun-Su Ju, Hwaseong-si (KR);
In-Gyu Baek, Seoul (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 13/462,844

(22) Filed: May 3, 2012

(65) Prior Publication Data

US 2013/0009122 A1    Jan. 10, 2013

(30) Foreign Application Priority Data

Jul. 4, 2011  (KR) .................... 10-2011-0066052

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 23/053* | (2006.01) |
| *H01L 23/12* | (2006.01) |
| *H01L 23/48* | (2006.01) |
| *H01L 23/52* | (2006.01) |
| *H01L 29/40* | (2006.01) |

(52) U.S. Cl.
USPC ........... 257/314; 257/315; 257/700; 257/758; 257/E21.627; 257/E21.641; 257/E23.011; 257/E23.143; 257/E23.145; 257/E23.146

(58) Field of Classification Search
USPC .................. 257/700, 758, E21.627, E21.641, 257/E23.011, E23.143, E23.145, E23.146, 257/314–315
See application file for complete search history.

(56) References Cited

U.S. PATENT DOCUMENTS

| | | | | |
|---|---|---|---|---|
| 7,622,808 B2 * | 11/2009 | Ohtake et al. | ................. | 257/760 |
| 7,700,935 B2 * | 4/2010 | Kim et al. | ........................ | 257/5 |
| 7,800,091 B2 * | 9/2010 | Kamigaichi et al. | ............... | 257/3 |
| 7,956,443 B2 * | 6/2011 | Akram et al. | ................. | 257/621 |
| 8,124,968 B2 * | 2/2012 | Koo et al. | ........................ | 257/42 |
| 8,134,203 B2 * | 3/2012 | Izumida et al. | ............... | 257/326 |
| 8,264,031 B2 * | 9/2012 | Kidoh et al. | ................. | 257/326 |
| 8,283,719 B2 * | 10/2012 | Huo et al. | ..................... | 257/324 |
| 8,319,264 B2 * | 11/2012 | Kim | ............... | 257/296 |
| 8,324,675 B2 * | 12/2012 | Moon et al. | ................... | 257/314 |
| 8,415,674 B2 * | 4/2013 | Lim et al. | ........................ | 257/67 |
| 2009/0321878 A1 | 12/2009 | Koo et al. | | |
| 2011/0140070 A1 * | 6/2011 | Kim | ................. | 257/5 |
| 2011/0227141 A1 * | 9/2011 | Jeong et al. | ................... | 257/324 |

(Continued)

FOREIGN PATENT DOCUMENTS

| | | |
|---|---|---|
| JP | 2008135744 | 6/2008 |
| JP | 2008277543 | 11/2008 |

(Continued)

*Primary Examiner* — Ida M Soward
(74) *Attorney, Agent, or Firm* — Volentine & Whitt, PLLC

(57) ABSTRACT

A non-volatile memory device includes a lower molding layer, a horizontal interconnection line on the lower molding layer, an upper molding layer on the horizontal interconnection line, pillars extending vertically through the upper molding layer, the horizontal interconnection line, and the lower molding layer, and a buffer layer interposed between the pillars and the molding layers. The device also includes variable resistance material and a diode layer interposed between the pillars and the horizontal interconnection line.

9 Claims, 36 Drawing Sheets

(56) References Cited

U.S. PATENT DOCUMENTS

| | | | |
|---|---|---|---|
| 2011/0233631 A1* | 9/2011 | Son et al. | 257/298 |
| 2011/0298038 A1* | 12/2011 | Son et al. | 257/324 |
| 2012/0001252 A1* | 1/2012 | Alsmeier et al. | 257/321 |
| 2012/0132981 A1* | 5/2012 | Imamura et al. | 257/321 |
| 2012/0161094 A1* | 6/2012 | Huo et al. | 257/4 |
| 2012/0299194 A1* | 11/2012 | Lee et al. | 257/774 |
| 2013/0049225 A1* | 2/2013 | Kang et al. | 257/774 |

FOREIGN PATENT DOCUMENTS

| | | |
|---|---|---|
| JP | 2010010688 | 1/2010 |
| JP | 2010282673 | 12/2010 |
| KR | 1020080048314 | 6/2008 |
| KR | 1020100001260 | 1/2010 |
| KR | 100994868 | 11/2010 |

* cited by examiner

US 8,525,247 B2

NON-VOLATILE MEMORY DEVICE HAVING VARIABLE RESISTANCE ELEMENT

PRIORITY STATEMENT

This application claims priority under 35 U.S.C. §119 to Korean Patent Application No. 10-2011-0066052 filed on Jul. 4, 2011, the disclosure of which is hereby incorporated by reference in its entirety.

BACKGROUND

1. Field

The inventive concept relates to a non-volatile memory device having a stack of memory cells and to a method of fabricating the same. More particularly, the inventive concept relates to non-volatile memory devices including stacks of word lines, bit lines, and variable resistors connected between the word lines and the bit lines, and to a method of fabricating the same.

2. Description of the Related Art

Various techniques of vertically forming a plurality of memory cells on a substrate have been researched as a way to scale down non-volatile memory devices, i.e., to provide a large memory capacity per unit of surface area of the substrate. One such type of non-volatile memory device being developed is a vertical resistive random access memory (ReRAM). A vertical ReRAM may include stacks of word lines, bit lines, and variable resistors between the word lines and the bit lines.

SUMMARY

In accordance with an aspect of the inventive concept, there is provided a semiconductor device which includes a lower molding layer, a horizontal interconnection line disposed on the lower molding layer, an upper molding layer disposed on the horizontal interconnection line, a pillar extending vertically through the upper molding layer, the horizontal interconnection line, and the lower molding layer, a buffer layer interposed between the pillar and each of the lower and upper molding layers, and variable resistance material and a diode layer interposed between the pillar and the horizontal interconnection line.

In accordance with another aspect of the inventive concept, there is provided a semiconductor device which includes, a lower molding layer, a horizontal interconnection line disposed on the lower molding layer, an upper molding layer disposed on the horizontal interconnection line, a pillar extending vertically through the upper molding layer, the horizontal interconnection line, and the lower molding layer, a conductive pad disposed on the pillar, and variable resistance material and a diode layer interposed between the pillar and the horizontal interconnection line. The pillar has a core and an electrode layer surrounding the core. The conductive pad covers sidewalls of the electrode layer.

Each of the first and second buffer layers may include silicon oxide or silicon.

In accordance with still another aspect of the inventive concept, there is provided a semiconductor device which includes A non-volatile semiconductor device, comprising: a semiconductor substrate, a stack of word lines disposed on the substrate, a pillar extending vertically through the stack of word lines to the semiconductor substrate so as to have a bottom surface contacting the semiconductor substrate and an outer side surface extending upwardly from the periphery of the bottom surface, variable resistance material extending around the pillar as interposed between the pillar and the word lines of the stack, a buffer layer extending around the pillar above and below each of the word lines, and a bit line. The pillar comprises an electrically conductive electrode layer, and the bit line is electrically connected to the electrode layer of the pillar.

BRIEF DESCRIPTION OF THE DRAWINGS

The foregoing and other aspects, features and advantages of the inventive concept will be apparent from the detailed description of preferred embodiments of the inventive concept that follows, made with reference to the accompanying drawings. In the drawings:

FIGS. 9 through 36 illustrate an embodiment of a method of fabricating a non-volatile memory device according to the inventive concept, wherein FIGS. 9, 11, 17, 20, 22, 25, 28, 31 and 34 are each a perspective view of a structure formed during the course of the method, FIGS. 10, 12, 13, 18, 21, 23, 24, 26, 29, 32 and 35 are each a vertical sectional view of a structure formed during the course of the method, and FIGS.

Figure 43:
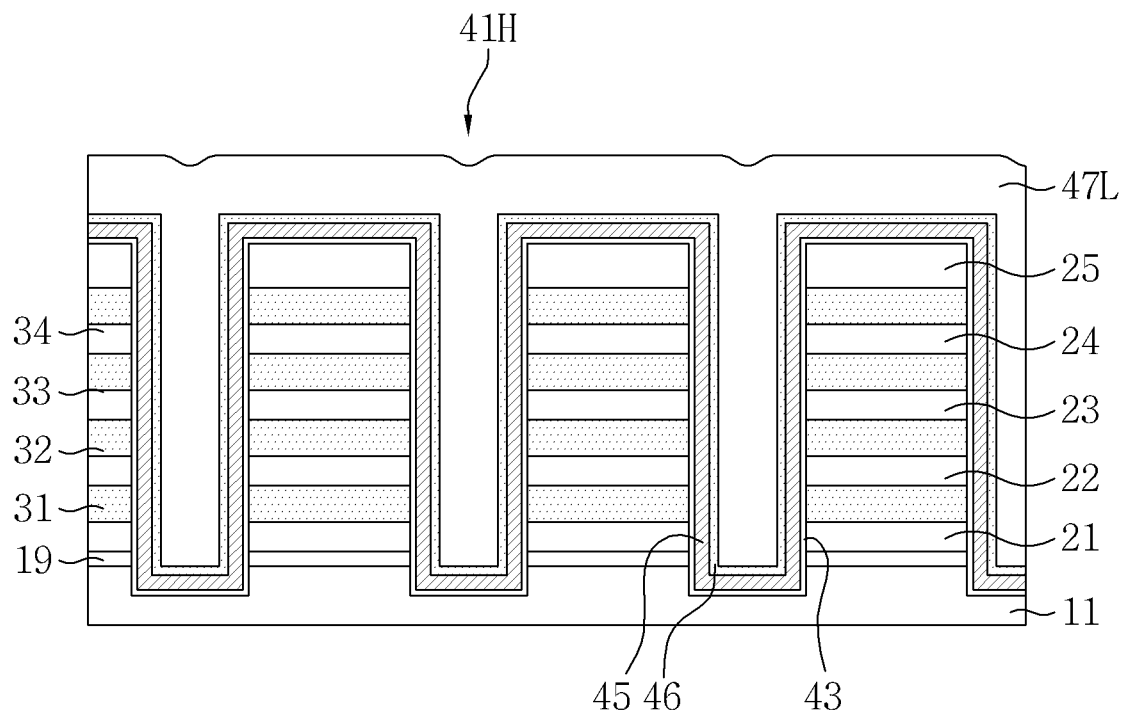
Figure 44:
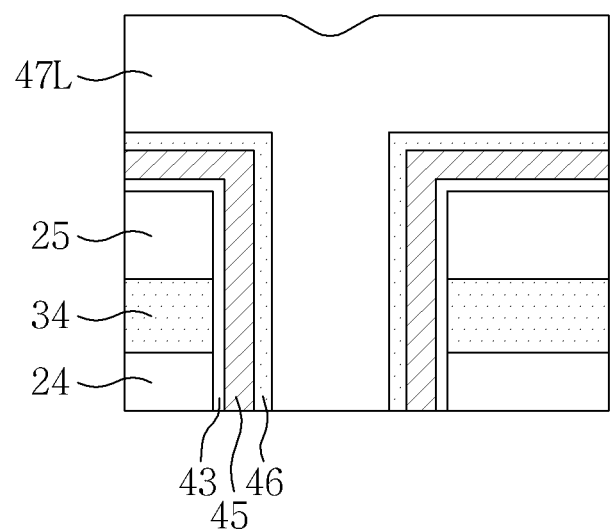
Figure 45:
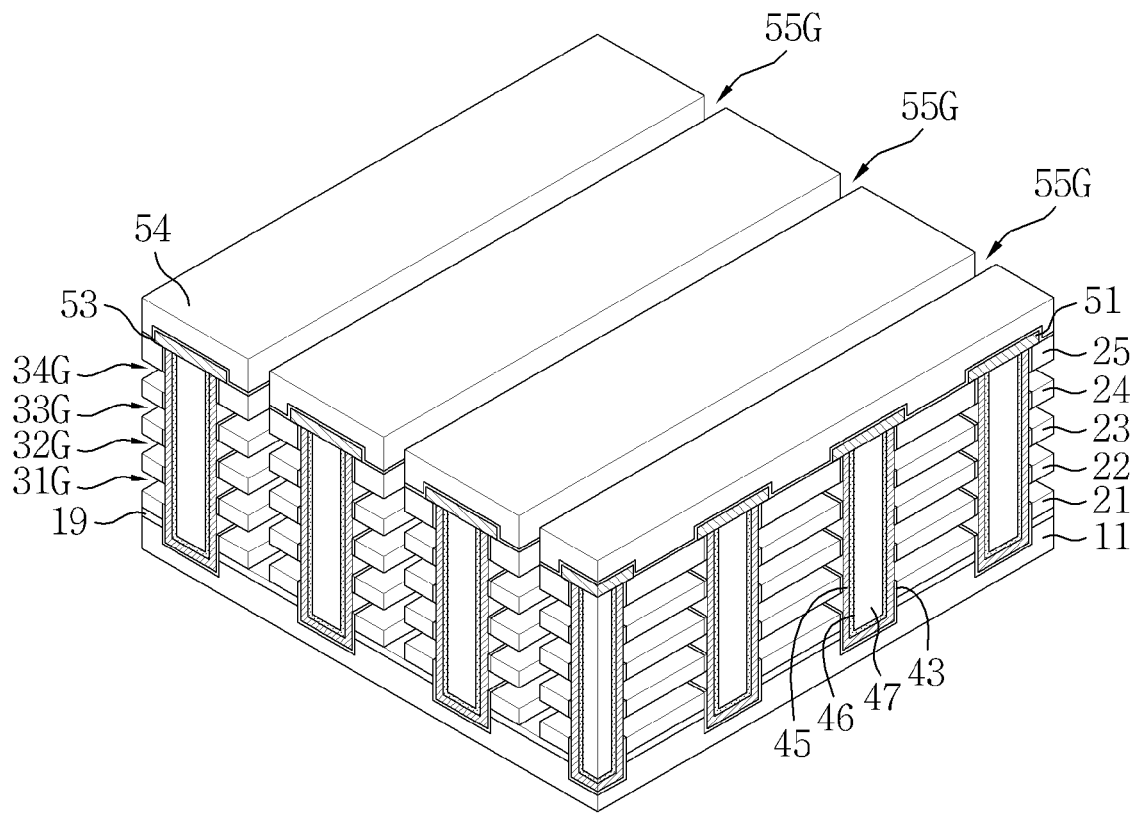
Figure 48:
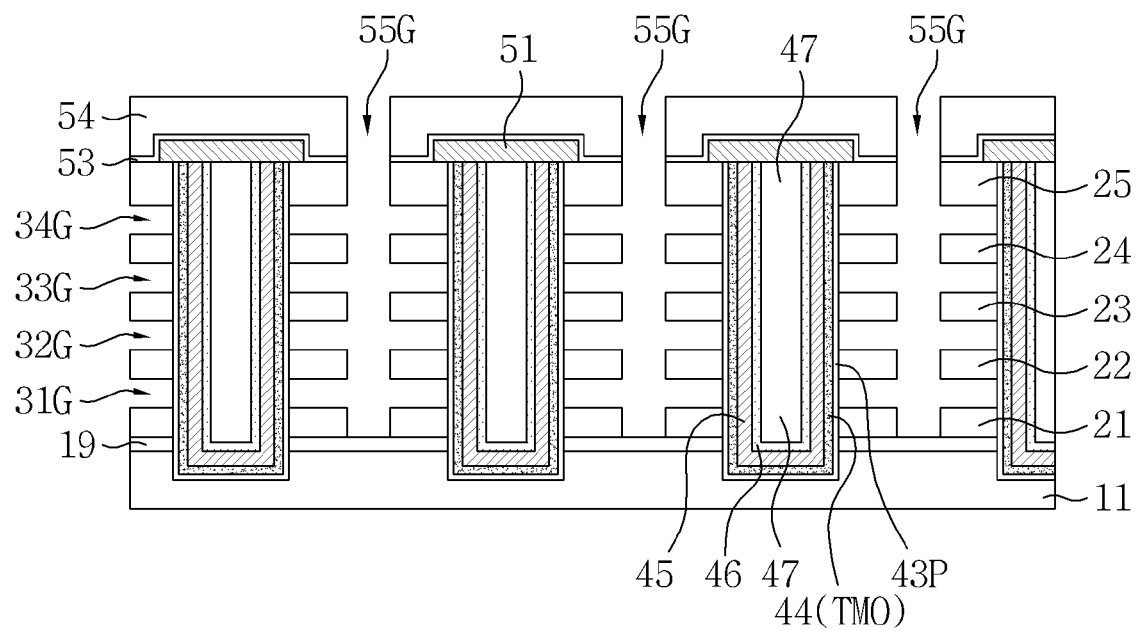
Figure 49:
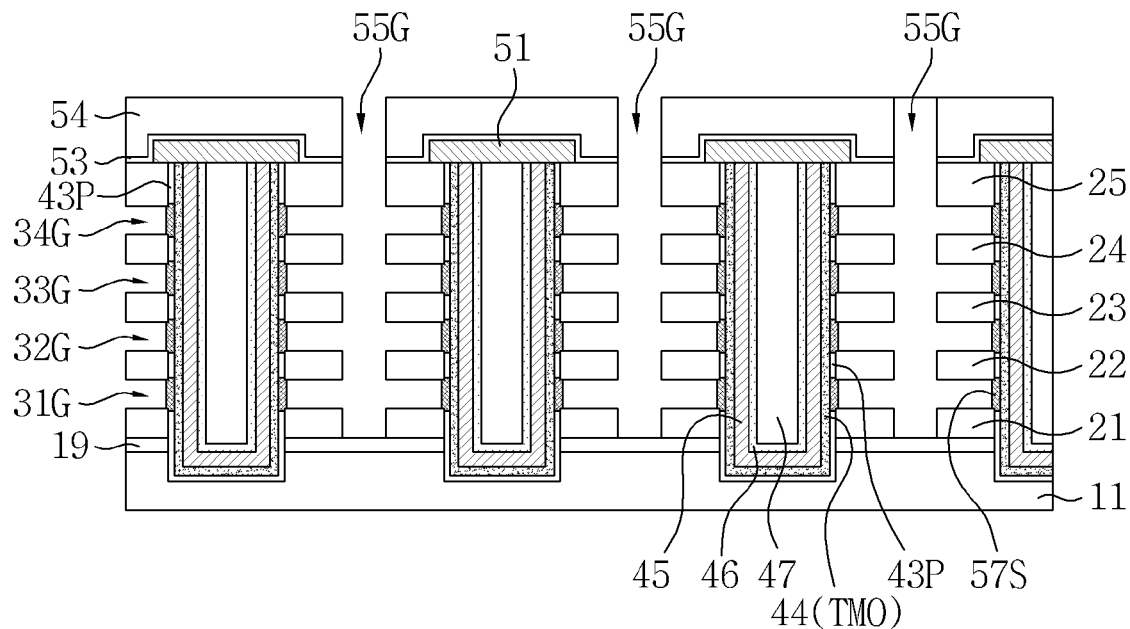
Figure 50:
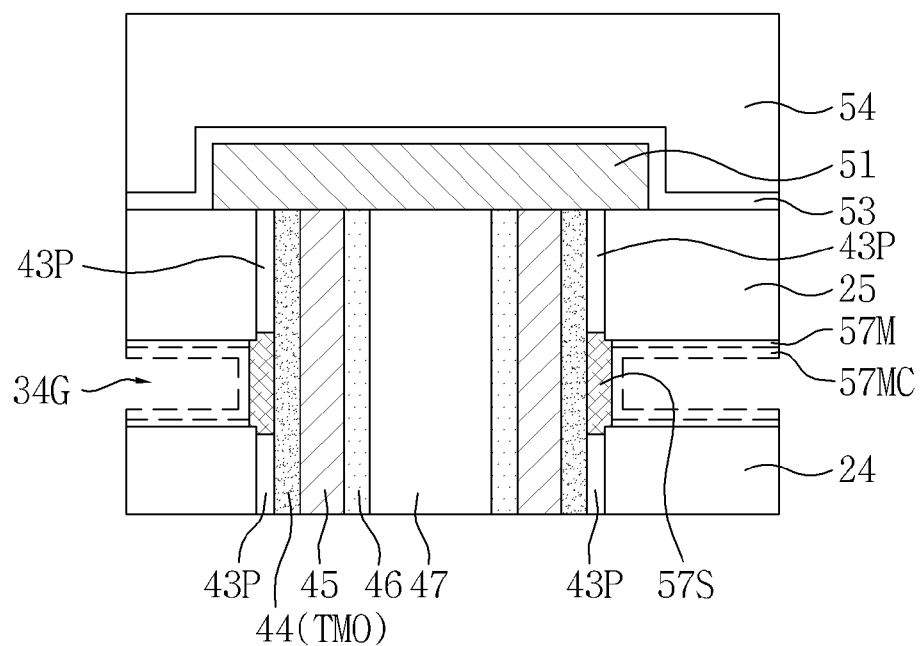
Figure 51:
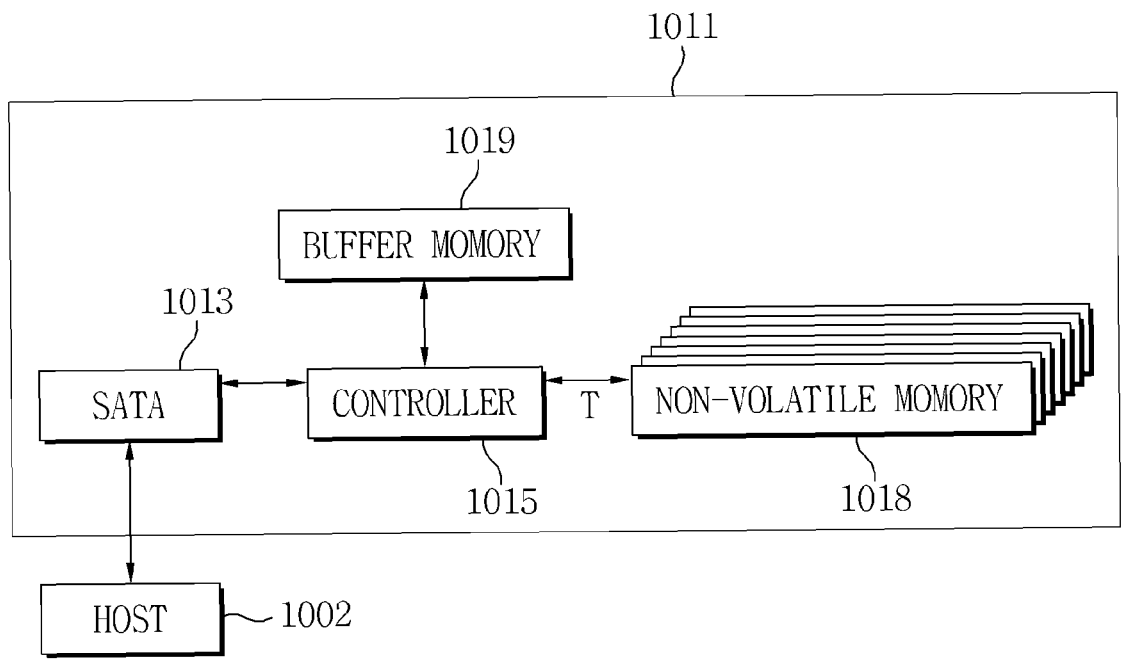
Figure 52:
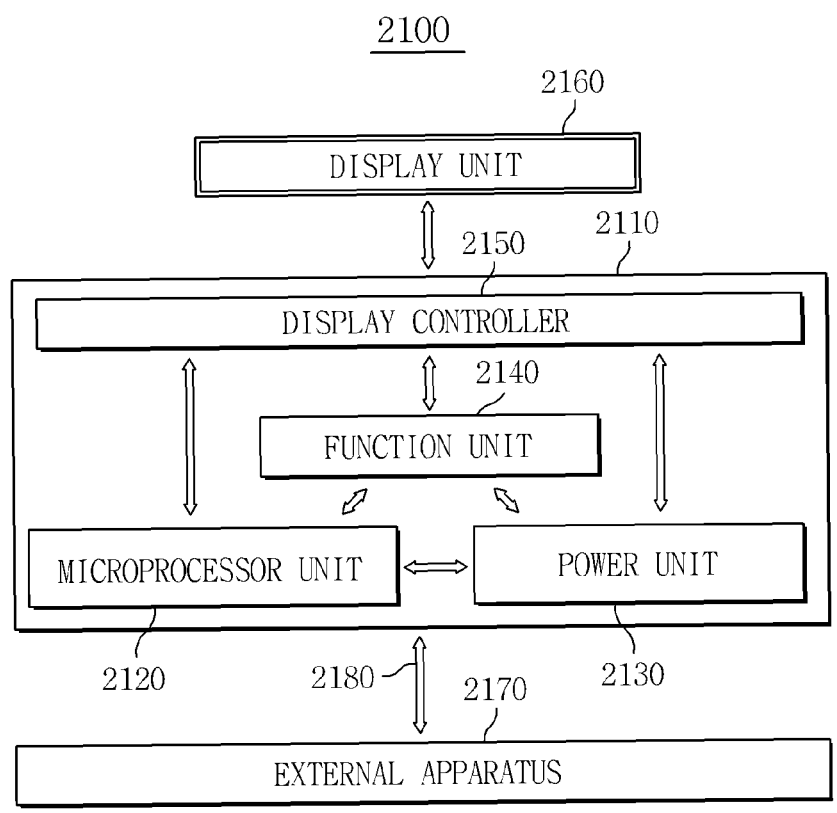

14, 15, 16, 19, 27, 30, 33 and 36 are each an enlarged sectional view of part of a structure formed during the course of the method;

FIGS. 37 through 42 are cross-sectional views and partial enlarged views illustrating a method of fabricating a non-volatile memory device according to a sixth embodiment of the inventive concept;

FIGS. 43 through 47 illustrate essential steps in another embodiment of a method of fabricating a non-volatile memory device according to the inventive concept, wherein FIGS. 37, 39, 41, 43 and 46 are each a vertical sectional view of a structure formed during the course of the method, FIGS. 38A, 38B, 38C, 40A, 40B, 42, 44 and 47 are each an enlarged sectional view of part of a structure formed during the course of the method, and FIG. 45 is a perspective view of a structure formed during the course of the method;

FIGS. 48 through 50 illustrate essential steps in still another embodiment of a method of fabricating a non-volatile memory device according to the inventive concept, wherein FIGS. 48 and 49 are each a vertical sectional view of a structure formed during the course of the method, and FIG. 50 is an enlarged sectional view of part of a structure formed during the course of the method;

FIG. 51 is a block diagram of an electronic system that employs a non-volatile memory device, according to the inventive concept; and FIG. 52 is a block diagram of another electronic system that employs a non-volatile memory device, according to the inventive concept.

DETAILED DESCRIPTION OF THE PREFERRED EMBODIMENTS

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer in question is referred to as being "on" another element or layer, the element or layer in question can be directly on the other element or layer or intervening elements or layers may be present.

Furthermore, the terms first, second, third, etc., are used herein to designate particular elements or layers. However, these elements and/or layers are not limited by these terms. Rather, these terms are only used to distinguish one element or layer from another.

Furthermore, spatially relative terms, such as "top end", "upper" and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Furthermore, the meanings of the terms "layer" and "film" are to be taken in context especially with reference to the drawings. For instance, the term "layer" is generally used to denote material that was formed or deposited altogether at one time and thus, may be used at times to denote a contiguous layer or merely a segment or discrete section of a contiguous or non-contiguous layer of material.

Embodiment 1

Figure 1A:
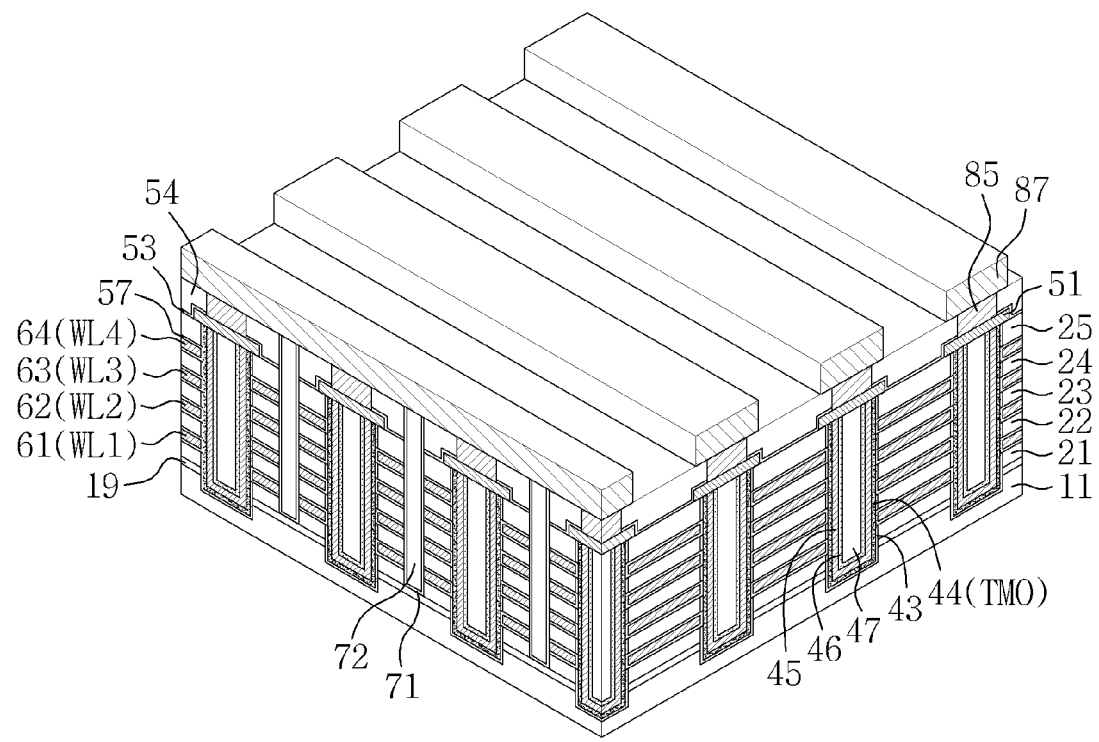
FIG. 1A is a perspective view of a first embodiment of a non-volatile memory device according to the inventive concept.

A first embodiment of a non-volatile memory device according to the inventive concept will now be described with reference to FIGS. 1A through 3G Referring first to FIGS. 1A, 2, and 3A, the memory device includes a semiconductor substrate 11, a substrate buffer layer 19 covering the semiconductor substrate 11, and molding layers 21, 22, 23, 24, and 25 and layers of 61, 62, 63, and 64 of word lines WL1, WL2, WL3 and WL4 (first horizontal interconnection lines) alternately disposed on the substrate buffer layer 19.

The memory device also includes variable resistance material 44 and bit pillars 45, 46, 47 extending vertically through the molding layers 21 through 25, the word line layers 61 through 64, and the substrate buffer layer 19. The variable resistance material 44 encases the sidewalls and bottoms of the bit pillars 45, 46, 47. In this respect, the bit pillars 45, 46, 47 may have various cross-sectional shapes such as a circular cross-sectional shape or a square cross-sectional shape (as in the illustrated example) or the like. Hence, the variable resistance material 44 may generally have the form of a pipe whose cross section has the shape of a circle or square (as in the illustrated example) or the like.

The variable resistance material 44 of this embodiment according to the inventive concept comprises a transition metal oxide (TMO), such as titanium oxide (TiO), tantalum oxide (TaO), nickel oxide (NiO), zirconium oxide (ZrO), or hafnium oxide (HfO). Each of the bit pillars 45, 46, 47 may include an electrode layer 45, an etch stop layer 46, and a core 47 in the form of a pillar extending upright on the semiconductor substrate 11. In this case, the electrode layer 45 encases the sidewalls and bottom surfaces of the core 47, and the etch stop layer 46 is interposed between the electrode layer 45 and the core 47. The etch stop layer 46 may comprise silicon nitride. Also, a buffer layer 43 is interposed between the molding layers 21 through 25 and the variable resistance material 44.

The variable resistance material 44 may have a high resistance or a low resistance depending on the amount of current supplied thereto. For example, in this embodiment in which the variable resistance material 44 comprises a TMO, the variable resistance material 44 has a relatively high resistance in a reset state. A write current supplied to the variable resistance material 44 is such that the variable resistance material 44 has a relatively low resistance and hence, the current may flow through the variable resistance material 44. A read current lower than the write current is supplied to the variable resistance material 44 so that the variable resistance material 44 continues to have a low resistance during the read operation. On the other hand, a reset current higher than the write current can be such that the variable resistance material 44 has a high resistance that prevents the flow of current therethrough.

Still further, the memory device of this embodiment includes a diode layer 57 interposed between the word line layers 61 through 64 and the variable resistance material 44. The diode layer 57 may cover top and bottom surfaces of the word lines WL1 through WL4 of layers 61 through 64. The diode layer 57 serves to prevent leakage current from flowing between the variable resistance material 44 and the word lines.

In one example of this embodiment, the diode layer 57 is of a metal oxide having a different composition from the variable resistance material 44. For example, the diode layer 57 may be of at least one material selected from the group consisting of TiO, NiO, HfO, aluminum oxide, ZrO, zinc oxide (ZnO), TaO, niobium oxide (NbO), and tungsten oxide (WO). In another example of this embodiment, the diode layer 57 is a metal silicide or a metal layer. In this case, the word lines WL1 through WL4 of layers 61 through 64 each comprise a semiconductor material, such as polysilicon (poly-Si). Thus, the interface between the metal or metal silicide diode layer 57 and the word lines WL1 through WL4 of semiconductor material form a Schottky junction. That is, the diode layer 57 and the word lines WL1 through WL4 may constitute a Schottky diode.

Also, as shown in the figures, the memory device may include bit pads 51 (i.e., conductive pads) disposed on the fifth molding layer 25 and covering the bit pillars 45 to 47. A first interlayer insulating layer 53 and a second interlayer insulating layer 54 may also be provided to cover the fifth molding layer 25 and the bit pads 51. Bit plugs extend through the second and first interlayer insulating layers 54 and 53 and contact the bit pads 51, respectively. Furthermore, in this example, a third interlayer insulating layer 71 and a fourth interlayer insulating layer 72 encased by the third insulating layer 71 extend through the second interlayer insulating layer 54, the first interlayer insulating layer 53, the molding layers 21 through 25, and the word line layers 61 through 64. Bit lines 87 (second horizontal interconnection lines) extend along the second through fourth interlayer insulating layers 54, 71, and 72 and contact the bit plugs 85.

Figure 1B:
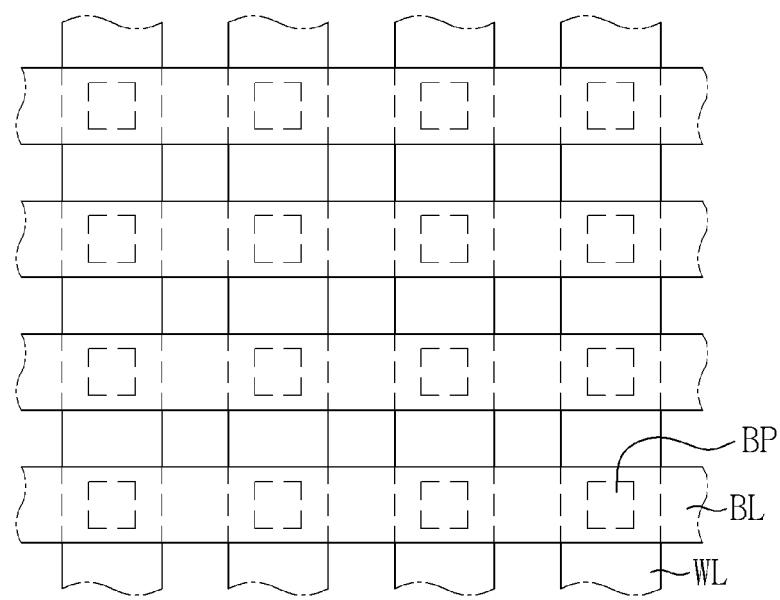
FIG. 1B is a diagram of a layout of the non-volatile memory device of FIG. 1A.
Figure 1C:
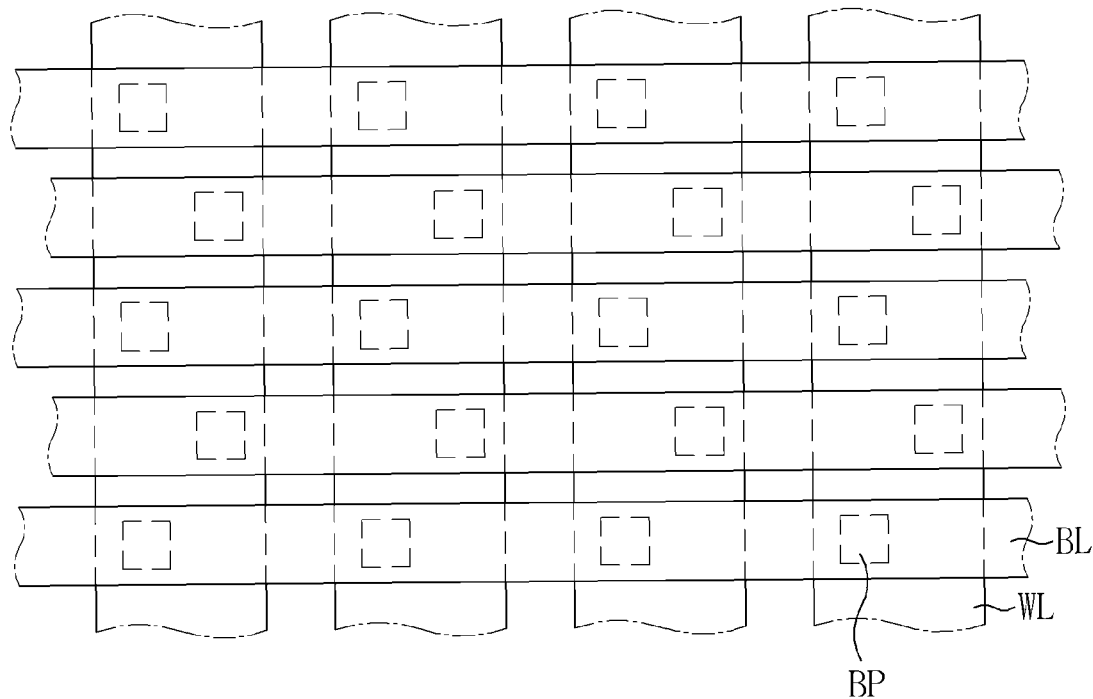
FIG. 1C is a diagram of a layout of another example of the first embodiment of a non-volatile memory device according to the inventive concept.
Figure 2:
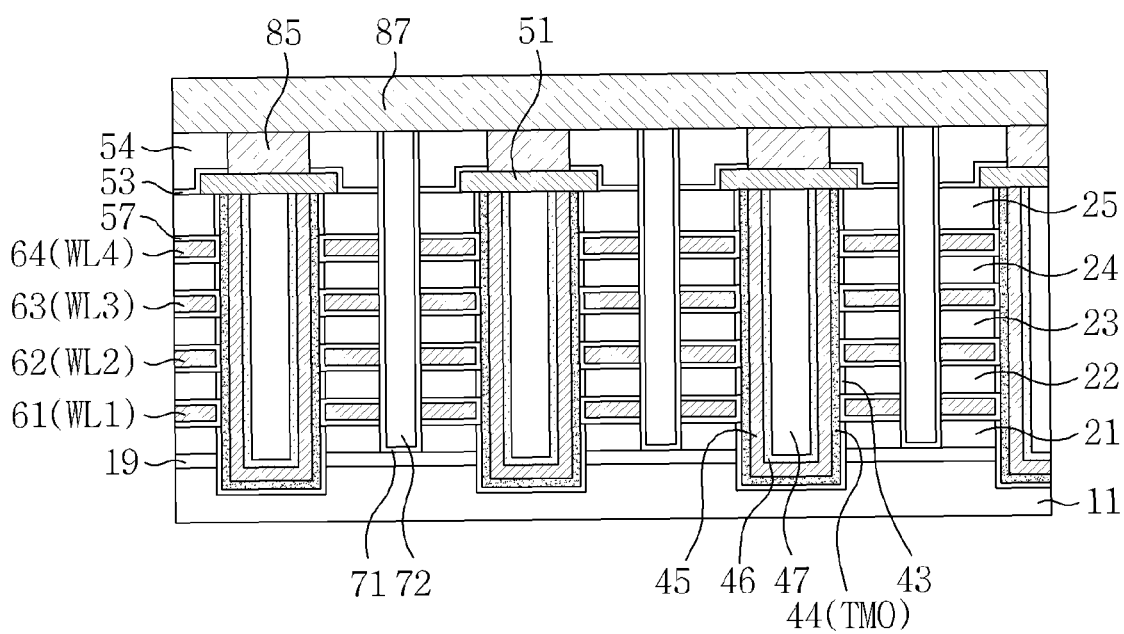
FIG. 2 is a vertical sectional view of the non-volatile memory device of FIG. 1A.

The bit pillars 45, 46, 47 (BP), the word lines WL1 through WL4 (WL), and the bit lines 87 (BL) may be laid out in the device in various ways, such as either of those shown in FIGS. 1B and 1C.

Referring to FIG. 1B, the bit pillars BP may be provided at the intersections between the stacks of word lines WL and the bit lines BL, respectively. More specifically, each bit pillar BP may be provided at a respective location where a bit line BL crosses a stack of word lines WL. Also, a set of bit pillars BP may be provided along each stack of word lines WL, and the bit lines BL may be spaced apart from each other at uniform intervals. Accordingly, the bit pillars BP of each set thereof are spaced from one another at uniform intervals along a respective stack of word lines WL.

Referring to FIG. 1C, the bit pillars BP of each set thereof may be arranged in a zigzag along a respective stack of the word lines WL.

Figure 3A:
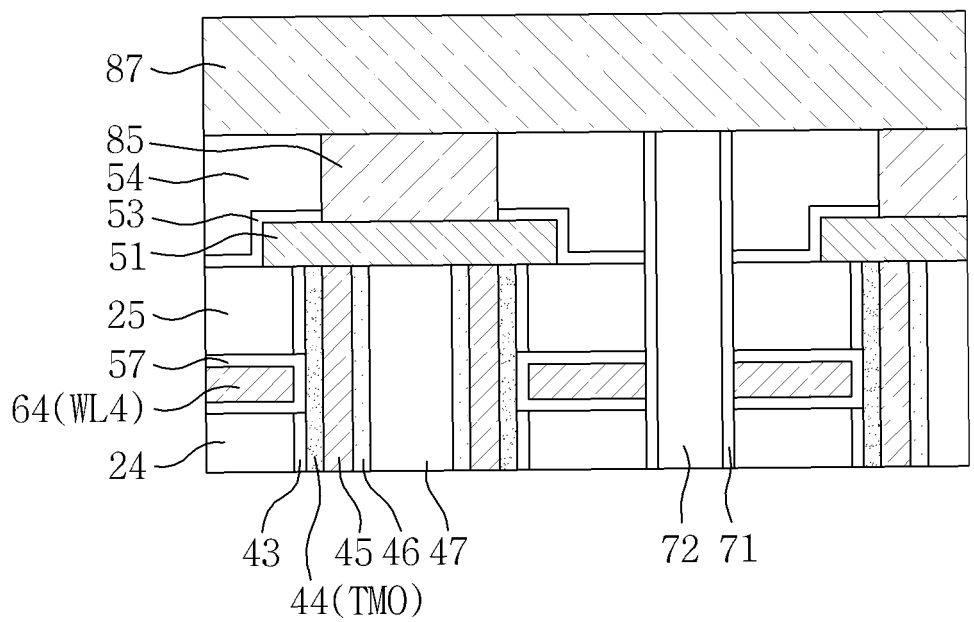
FIG. 3A is a enlarged cross-sectional view of a portion of the non-volatile memory device shown in FIG. 2.
Figure 3B:
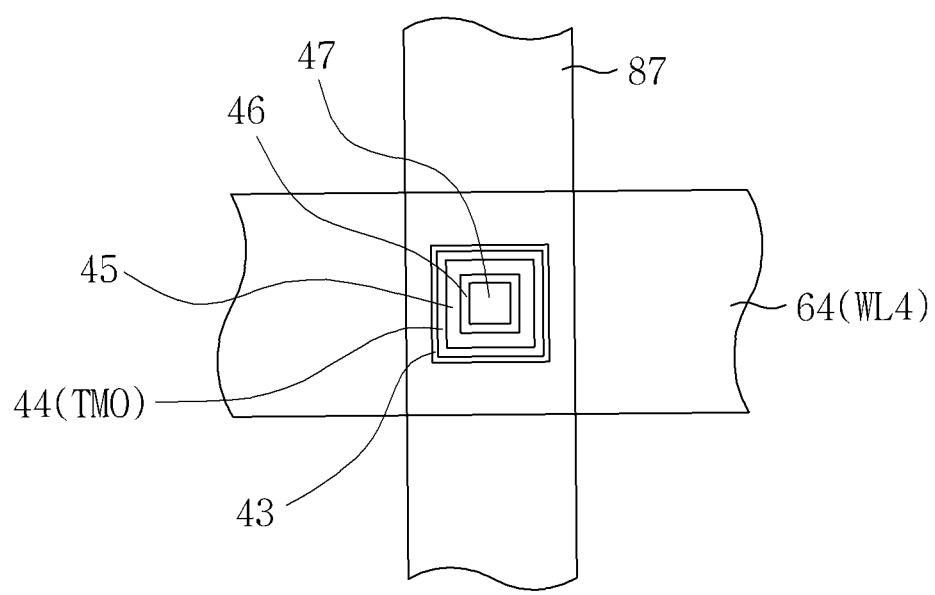
FIG. 3B is a perspective view of the portion of the device shown in FIG. 3A.
Figure 3C:
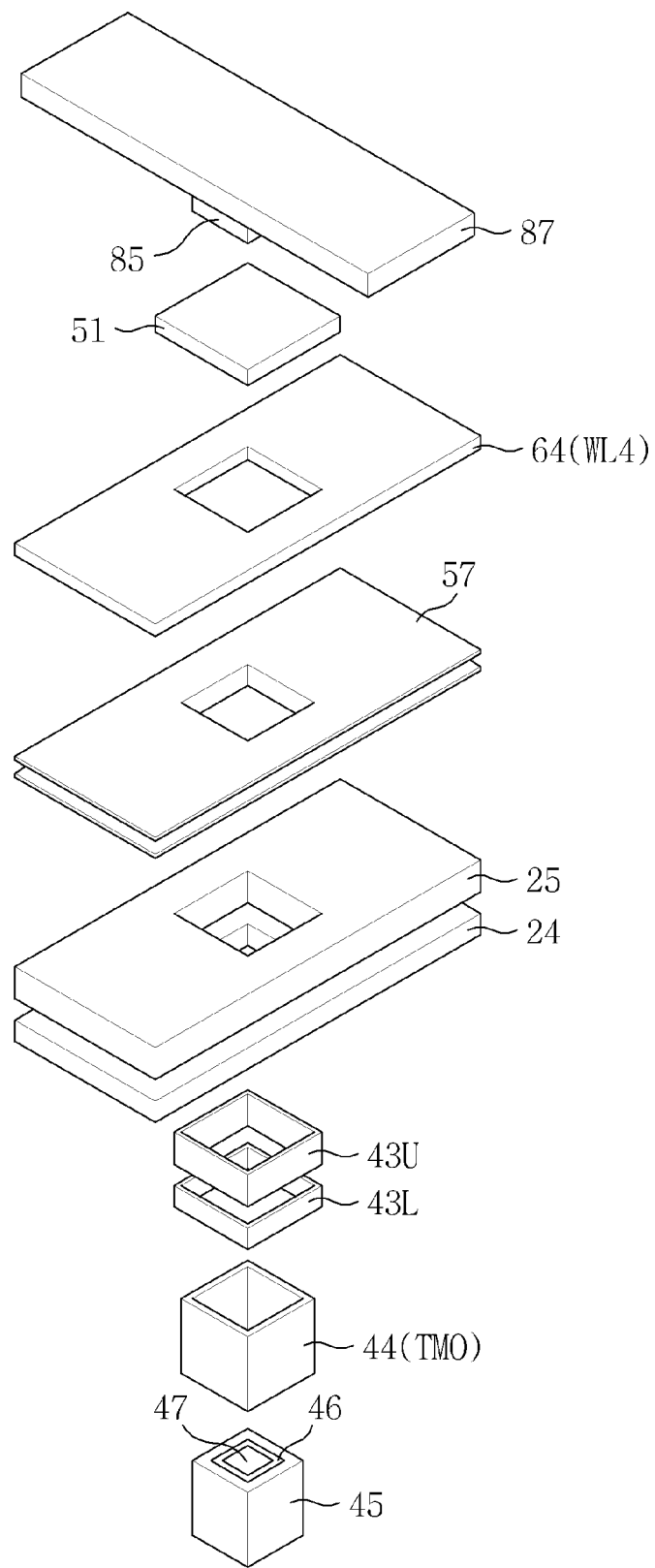
FIG. 3C is a perspective broken-away view of the portion of the device shown in FIGS. 3A and 3B.

FIGS. 3A through 3C show the region of the variable resistance material 44 and diode layer 57 in more detail.

As is especially well shown in these figures, the section of the buffer layer 43 interposed between the variable resistance material 44 and the fourth molding layer 24 may be regarded as a lower buffer layer or first buffer layer 43L, whereas the section of the buffer layer 43 interposed between the variable resistance material 44 and the fifth molding layer 25 may be regarded as an upper buffer layer or second buffer layer 43U. Each of the first and second buffer layers 43L and 43U surrounds the bit pillars 45, 46, 47 and, like the variable resistance material 44, has a square or circular cross section or the like.

Figure 3D:
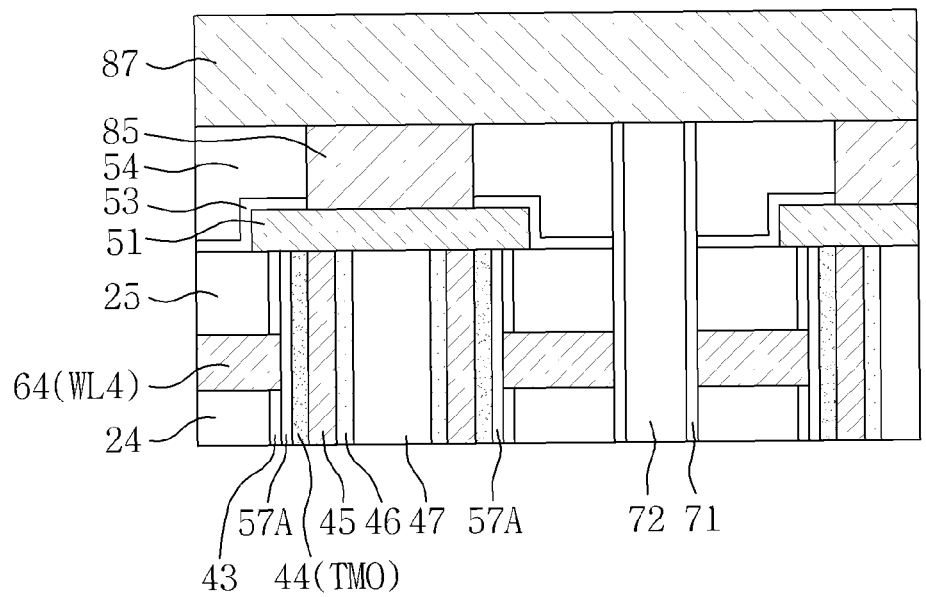
FIGS. 3D through 3G are enlarged cross-sectional views each similar to that of FIG. 3A, but illustrating other examples of the first embodiment of the non-volatile memory device according to the inventive concept.

Other examples of this region of the non-volatile memory device according to the inventive concept are shown in and will be briefly described with reference to FIGS. 3D through 3G In the example shown in FIG. 3D, a diode layer 57A extends along sidewalls of bit pillars 45, 46, 47. The diode layer 57A is interposed between a fourth word line WL4 and variable resistance material 44, and between the variable resistance material 44 and the buffer layer 43. The diode layer 57A also contacts a bit pad 51. In this case, the diode layer 57A comprises a metal oxide whose composition is different from that of the variable resistance material 44. For example, the diode layer 57A is of at least one material selected from the group consisting of TiO, NiO, HfO, AlO, ZrO, ZnO, TaO, NbO, and WO.

Figure 3E:
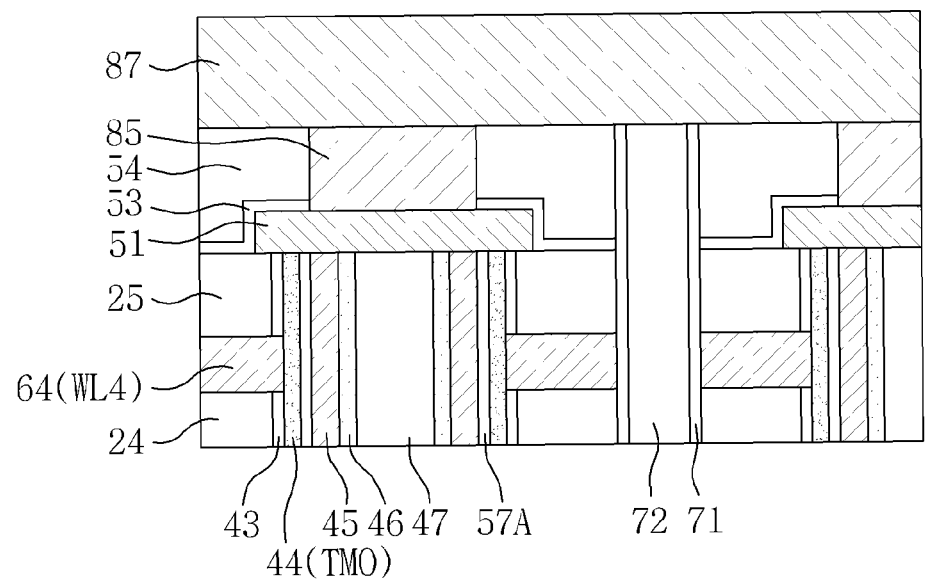

In the example shown in FIG. 3E, diode layer 57A is interposed between the electrode layer 45 and the variable resistance material 44. Again, the diode layer 57A comprises a metal oxide whose composition is different from that of the variable resistance material 44.

Figure 3F:
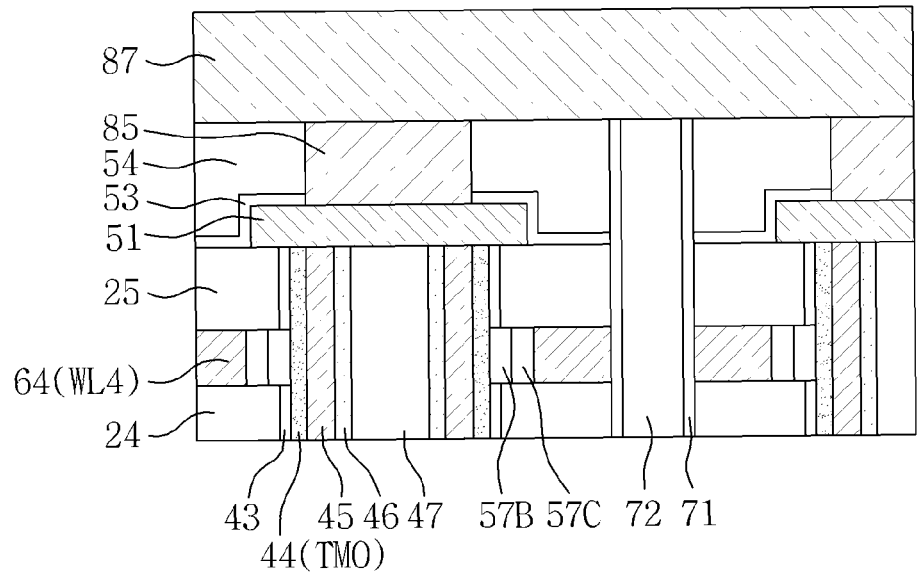

In the example shown in FIG. 3F, a diode layer 57B, 57C is interposed between the fourth word line 64 and the variable resistance material 44. The diode layer 57B, 57C is constituted by a first semiconductor film 57B, and a second semiconductor film 57C having a conductivity opposite that of the first semiconductor layer 57B. Also, in this example, the diode layer 57B, 57C is sandwiched between fourth and fifth molding layers 24 and 25.

Figure 3G:
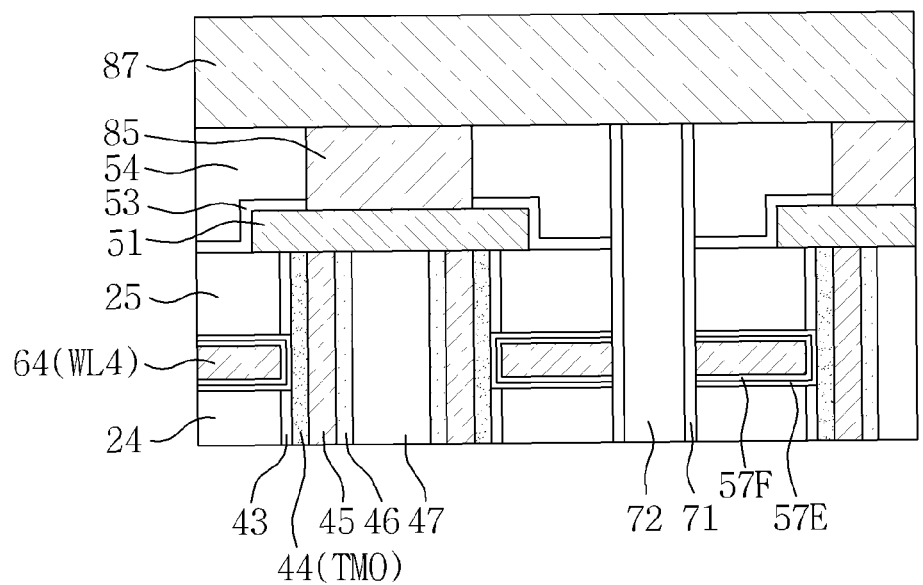

In the example shown in FIG. 3G, a diode layer 57E, 57F is interposed between the fourth word line 64 and the variable resistance material 44 and covers top and bottom surfaces of the fourth word line 64. The diode layer 57E, 57F is constituted by a first diode film 57E and a second diode film 57F and forms a Schottky diode. For example, the first diode film 57E may be of a semiconductor material, such as poly-Si, while the second diode film 57F may be a metal film or a metal silicide film. In the case of the former, the second diode film 57F may be a Mo, Ti, W, Ni, Pd, magnesium (Mg), chromium (Cr), gold (Au), or Pt film. In the case of the latter, the second diode film 57F may be an HfSi, molybdenum silicide (MoSi), ZrSi, TiSi, CoSi, WSi, NiSi, palladium silicide (PdSi), or platinum silicide (PtSi) film. Alternatively, the second diode film 57F may be formed of a semiconductor material, such as poly-Si, while the first diode film 57E is a metal or metal silicide film.

Embodiment 2

A second embodiment of a non-volatile memory device according to the inventive concept will now be described in detail with reference to FIG. 4 and FIGS. 5A through 5D. This embodiment is similar to that of the first embodiment and therefore, mainly only those aspects of this second embodiment which differ from those of the first embodiment will be described in detail.

Figure 4:
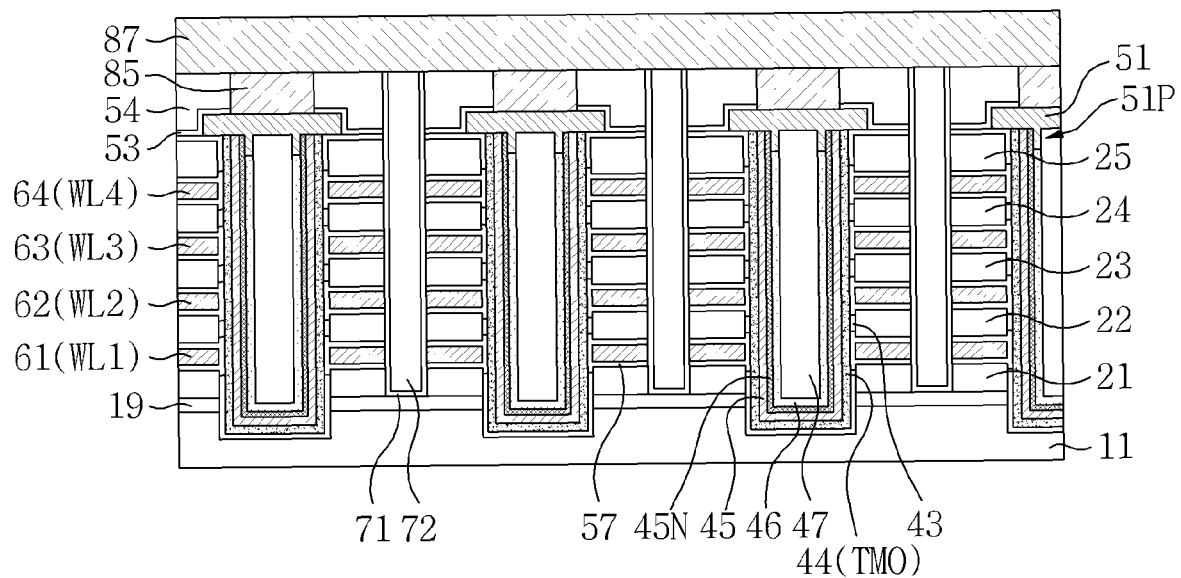
FIG. 4 is a cross-sectional view of a second embodiment of a non-volatile memory device according to the inventive concept.
Figure 5A:
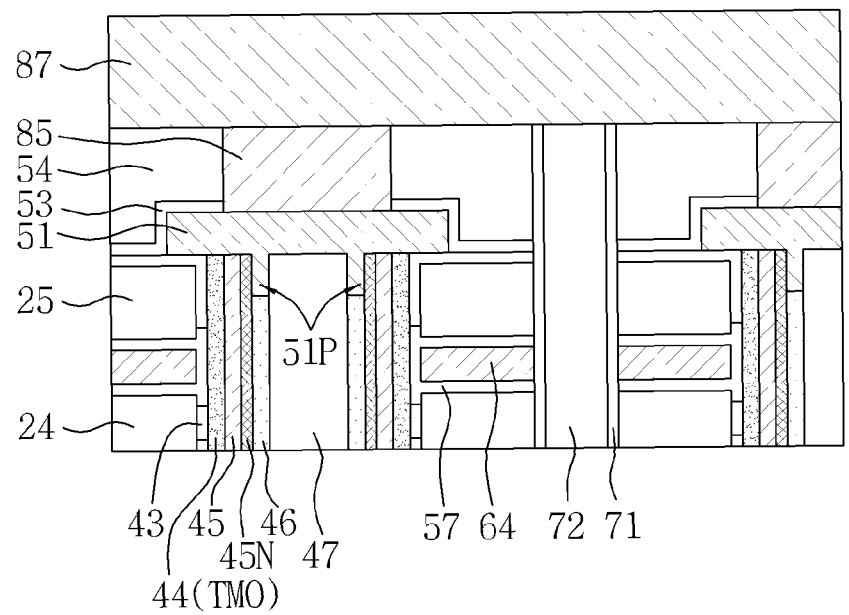
FIG. 5A is an enlarged cross-sectional view of a portion of the non-volatile memory device shown in FIG. 4.

Referring to FIGS. 4 and 5A, in the second embodiment of a non-volatile memory device according to the inventive concept, diode layer 57 is interposed between word lines WL1 through WL4 and variable resistance material 44, covers the top and bottom surfaces of the layers 61 through 64 of word lines WL1 through WL4, extends between the variable resistance material 44 and the first through fifth molding layers 21 through 25, and contacts the buffer layer 43. Also, the buffer layer 43 extends along the top surface of the fifth molding layer 25, and a portion of the buffer layer 43 is interposed between the fifth molding layer 25 and the bit pad 51.

Also, in this example as shown best in FIG. 5A, an N-rich metal layer 45N extends along a surface of electrode layer 45. The N-rich metal layer 45N contains a larger amount of nitrogen than the electrode layer 45. The etch stop layer 46 comprises a nitride, such as silicon nitride. Furthermore, the top end surface of the etch stop layer 46 is disposed at a level beneath each of those of the core 47 and N-rich metal layer 45N. In this respect, each bit pad 51 has protrusions 51P that extend between the core 47 and the N-rich metal layer 45N. Each of the protrusions 51P contacts the sidewalls of the N-rich metal layer 45N.

Figure 5B:
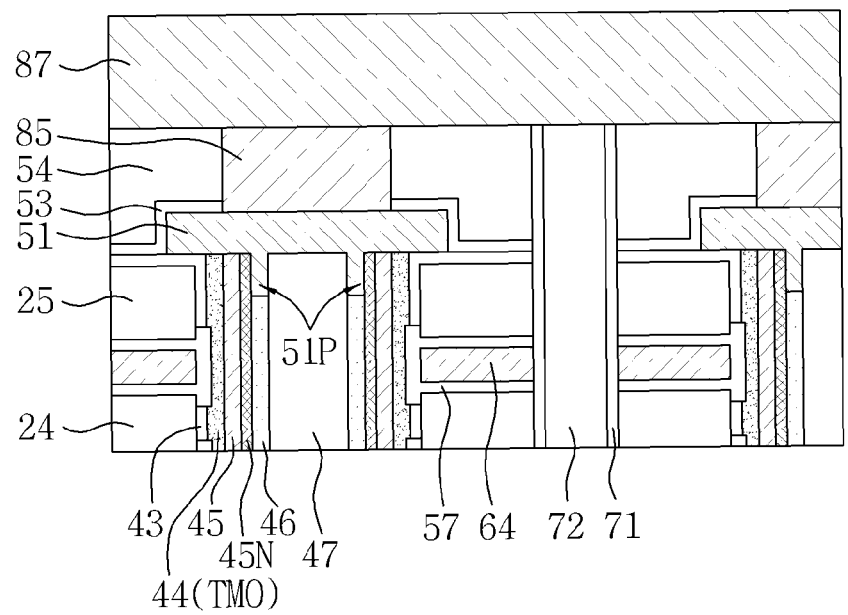
FIGS. 5B through 5D are enlarged cross-sectional views each similar to that of FIG. 5A, but illustrating other examples of the second embodiment of the non-volatile memory device according to the inventive concept.

In the example of the second embodiment shown in FIG. 5B, the section of the layer of the variable resistance material 44 interposed between the electrode layer 45 and the diode layer 57 is thinner than the section of the layer of variable resistance material 44 interposed between the electrode layer 45 and the buffer layer 43. Sidewalls of the variable resistance material 44 are recessed, and the recesses are occupied by the diode layer 57.

Figure 5C:
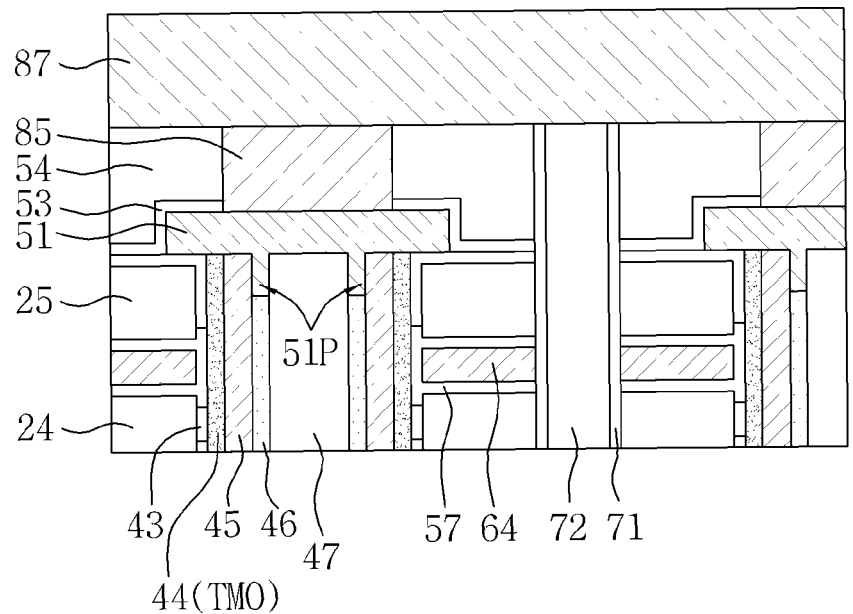

In the example shown in FIG. 5C, the top end surface of the etch stop layer 46 is disposed at a level beneath those of each of the core 47 and the electrode layer 45. Again, in this respect, each bit pad 51 has protrusions 51P that extend between the core 47 and the electrode layer 45. In this example, the protrusions 51P contact the sidewalls of the electrode layer 45.

Figure 5D:
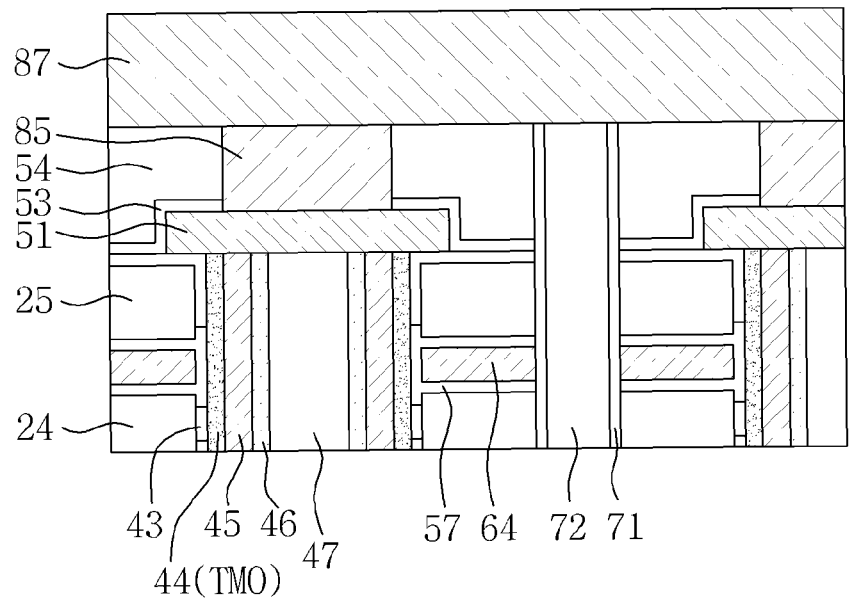

In the example shown in FIG. 5D, the top end surfaces of the electrode layer 45, the etch stop layer 46, and the core 47 are disposed at substantially the same level in the device.

Embodiment 3

A third embodiment of a non-volatile memory device according to the inventive concept will now be described in detail with reference to FIGS. 6A, 6B and FIG. 7A through 7C. Again, mainly only the differences between this embodiment and the first and second embodiments will be described in detail.

In the third embodiment of a non-volatile memory device according to the inventive concept, the variable resistance material covers top and bottom surfaces of word lines WL1 through WL4.

Figure 6A:
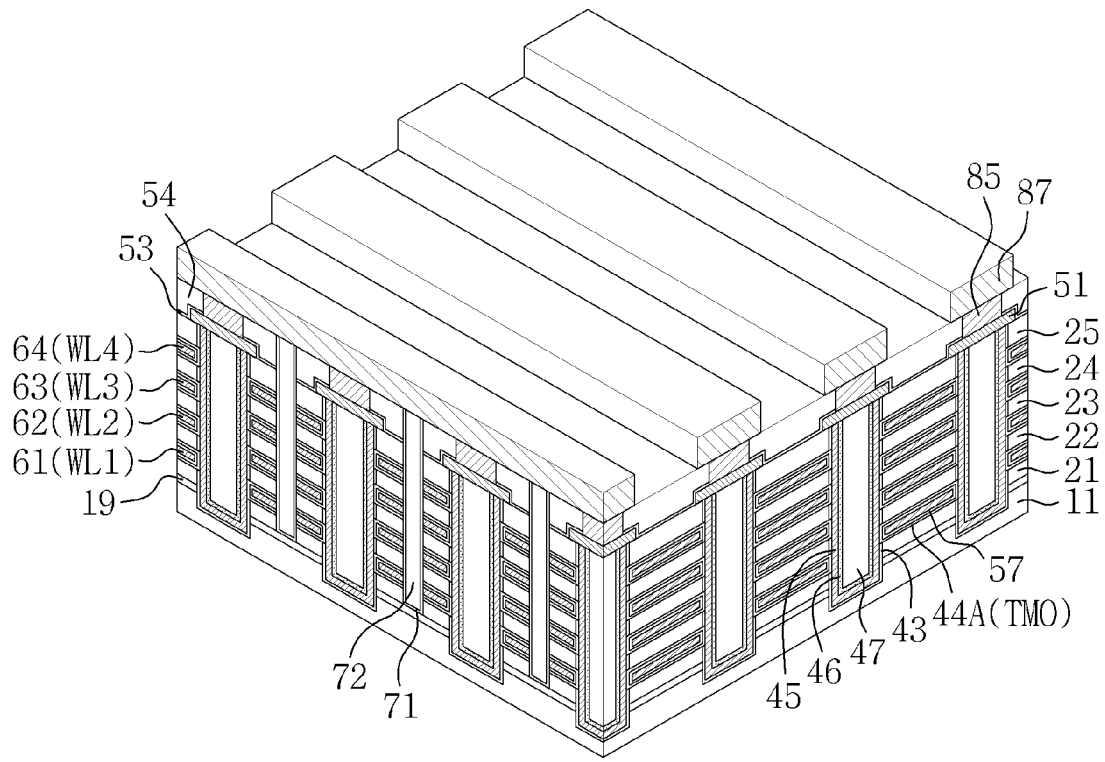
FIG. 6A is a perspective view of a third embodiment of a non-volatile memory device according to the inventive concept.
Figure 6B:
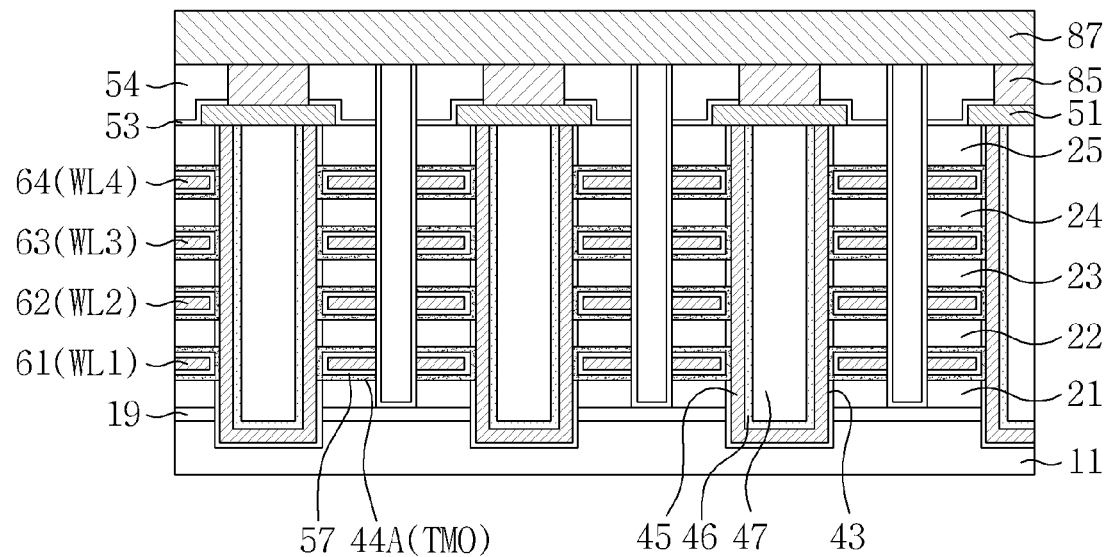
FIG. 6B is a vertical sectional view of of the non-volatile memory device of FIG. 6A.
Figure 7A:
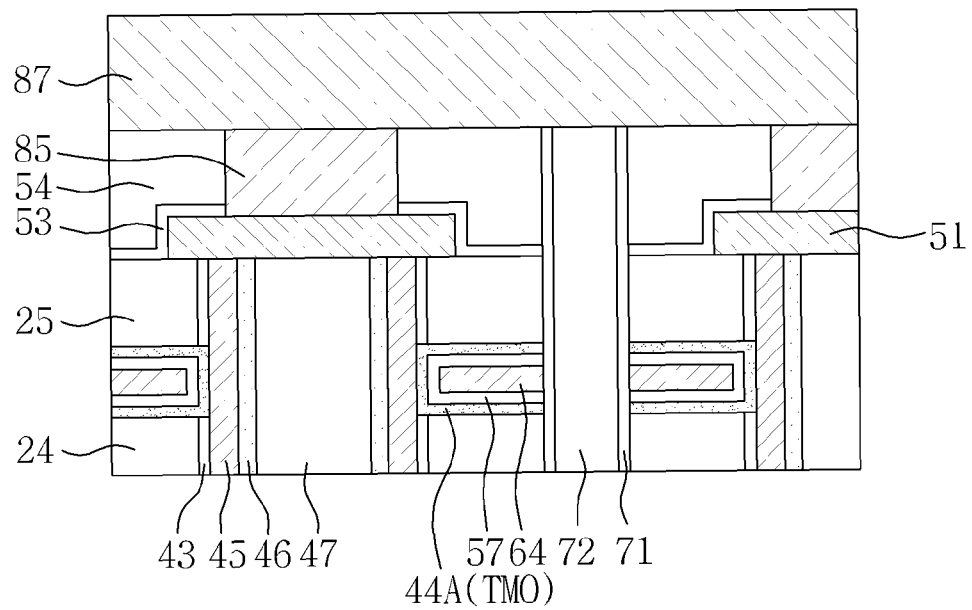
FIG. 7A is an enlarged cross-sectional view of a portion of the non-volatile memory device shown in FIG. 6B.

In the example of the third embodiment shown in FIGS. 6A, 6B, and 7A, electrode layer 45 contacts buffer layer 43. Variable resistance material 44A covers top and bottom surfaces of word lines WL1 through WL4, and is also interposed between the electrode layer 45 and the layers 61 through 64 of word lines WL1 through WL4. A diode layer 57 is interposed between the variable resistance material 44A and the word lines WL1 through WL4. Alternatively, though, the variable resistance material 44A may be interposed between the diode layer 57 and the word lines WL1 through WL4. In either case, the diode layer 57 may be a metal oxide layer whose composition is different from that of the variable resistance material 44A.

Figure 7B:
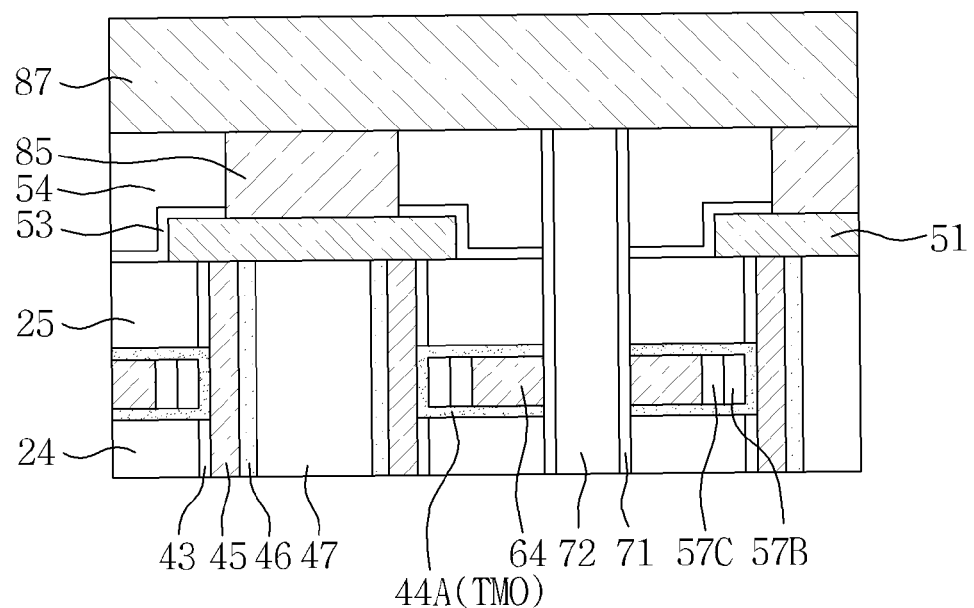
FIGS. 7B and 7C are enlarged cross-sectional views each similar to that of FIG. 7A, but illustrating other examples of the third embodiment of a non-volatile memory device according to the inventive concept.

In the example shown in FIG. 7B, the diode layer 57B, 57C is located entirely between the fourth word line WL4 and variable resistance material 44A, similarly to the example shown in FIG. 3F. Likewise, the diode layer 57B, 57C is constituted by a first semiconductor film 57B, and a second semiconductor layer 57C of a conductivity type different from that of the first semiconductor layer 57B.

Figure 7C:
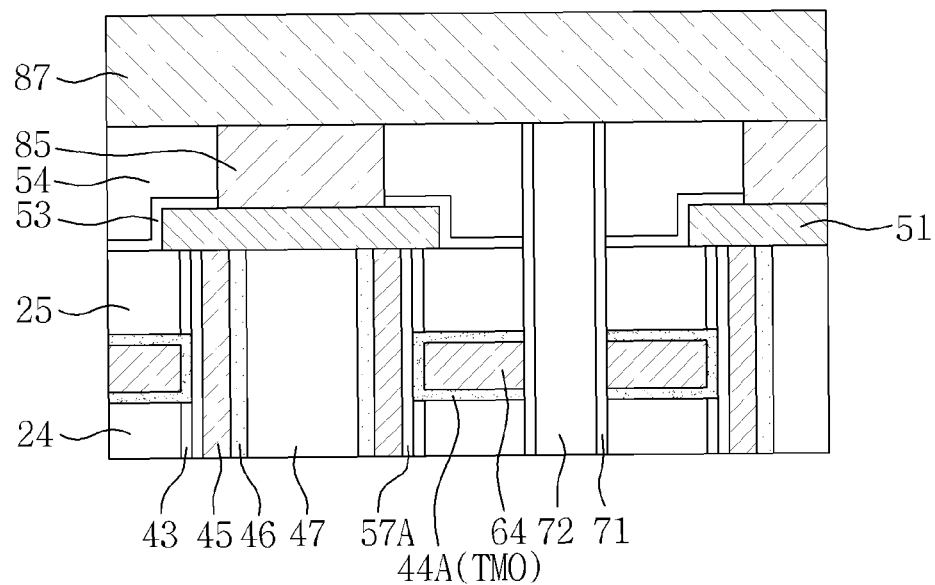

In the example shown in FIG. 7C, a diode layer 57A extends along the sidewalls of the electrode layer 45, surrounds the electrode layer 45, and is interposed between the electrode layer 45 and the variable resistance material 44A and between the electrode layer 45 and buffer layer 43.

Embodiment 4

Figure 8A:
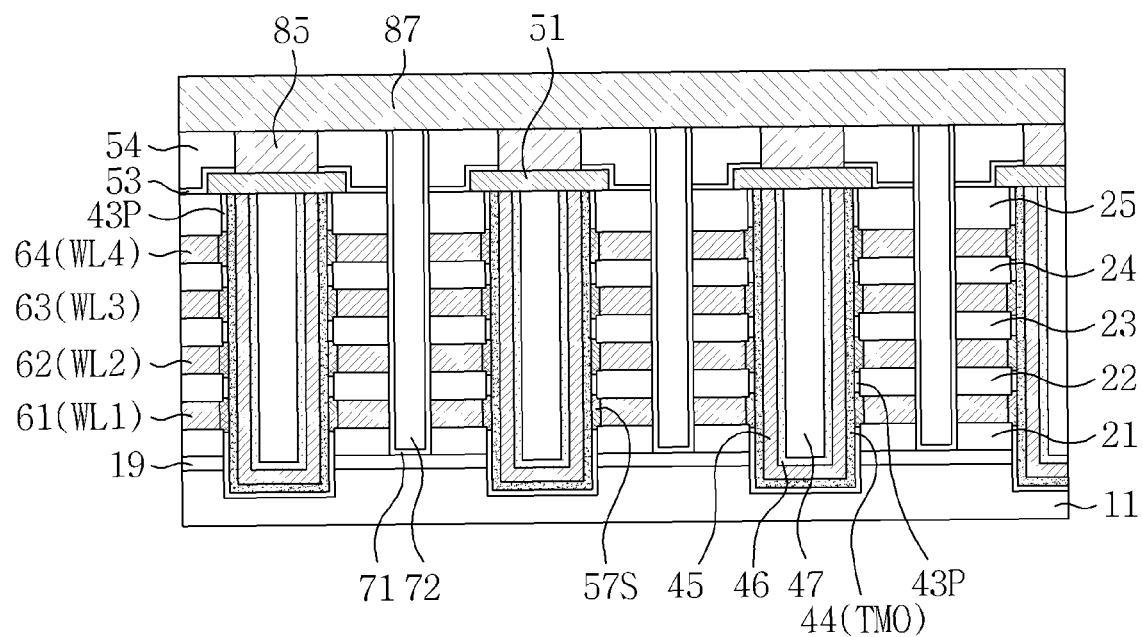
FIG. 8A is a cross-sectional view of a fourth embodiment of a non-volatile memory device according to the inventive concept.
Figure 8B:
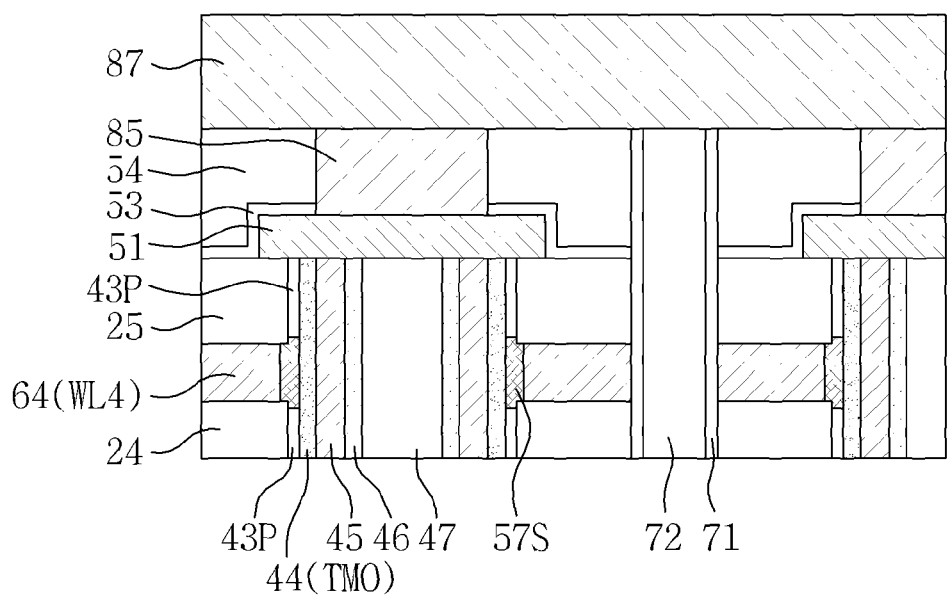
FIG. 8B is an enlarged cross-sectional view of a portion of the non-volatile memory device shown in FIG. 8A.

A fourth embodiment of a non-volatile memory device according to the inventive concept will now be described in detail with reference to FIGS. 8A and 8B. Again, for a description of many of the features aspects of this embodiment, reference may be made to the detailed description above.

In this embodiment, the buffer layer 43P is not contiguous, i.e., the buffer layer is constituted by a plurality of vertically aligned discrete buffer layer segments. A diode layer 57S is interposed between and contacts the discrete segments of the buffer layer 43P. More specifically, the diode layer 57 is also constituted by a plurality of vertically aligned discrete segments. Each segment of the diode layer 57S is interposed between the variable resistance material 44 and a respective one of the layers 61 through 64 of word lines WL1 through WL4. Also, in this example of the fourth embodiment, the segments of the buffer layer 43P are each retained between the variable resistance material 44 and a respective one of the molding layers 21 through 25.

A method of fabricating a non-volatile memory device according to the inventive concept will now be described in detail with reference to FIGS. 9 through 36.

Figure 9:
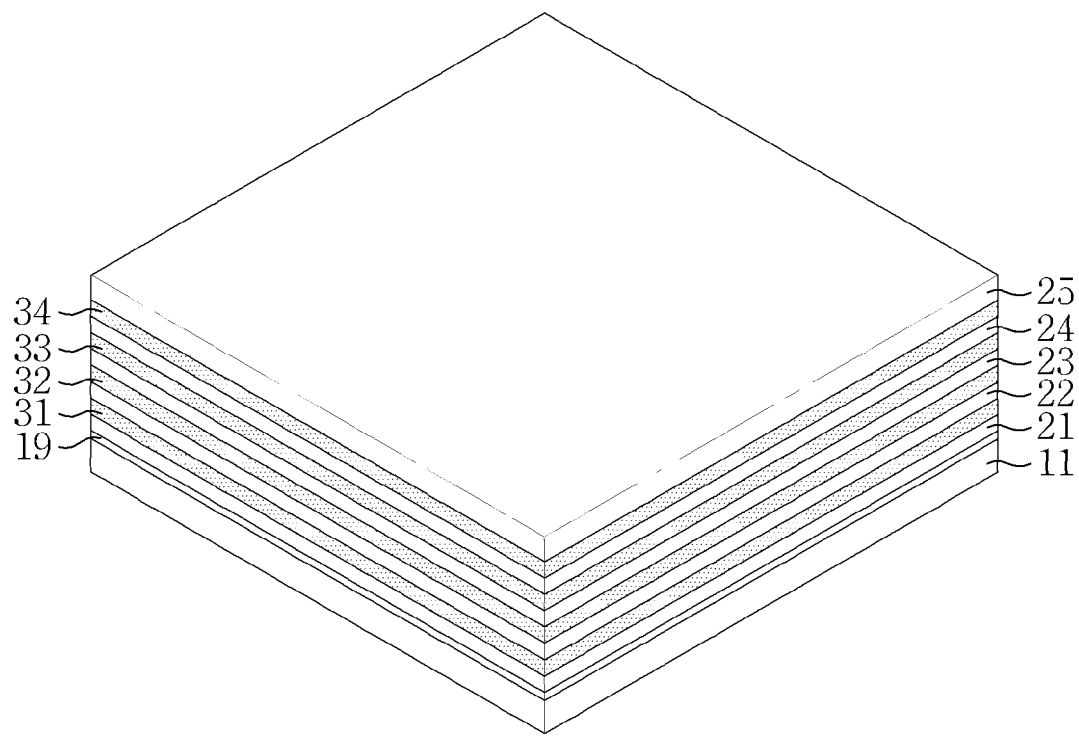
Figure 10:
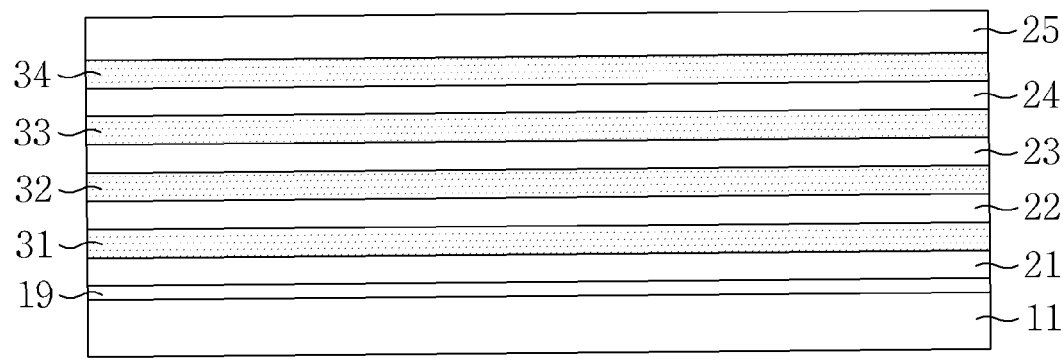

Referring first to FIGS. 9 and 10, a substrate buffer layer 19 is formed on a semiconductor substrate 11. The substrate buffer layer 19 may be a layer of silicon oxide formed using a chemical vapor deposition (CVD) process.

Next, a first molding layer 21 is formed on the substrate buffer layer 19 by a CVD process. A first sacrificial layer 31 is then formed on the first molding layer 21. Similarly, a second molding layer 22 is formed on the first sacrificial layer 31, and a second sacrificial layer 32 is formed on the second molding layer 22. This process may then be again repeated such that a third molding layer 23 is formed on the second sacrificial layer 32, a third sacrificial layer 33 is formed on the third molding layer 23, a fourth molding layer 24 is formed on the third sacrificial layer 33, and a fourth sacrificial layer 34 is formed on the fourth molding layer 24. Finally, a fifth molding layer 25 is formed on the fourth sacrificial layer 34.

The sacrificial layers 31 through 34 are formed of material having an etch selectivity with respect to the molding layers 21 through 25. For example, the molding layers 21 through 25 each comprise an oxide, such as silicon oxide, and the sacrificial layers 31 through 34 are each made of silicon nitride. Alternatively, the sacrificial layers 31 through 34 are layers of poly-Si.

Figure 11:
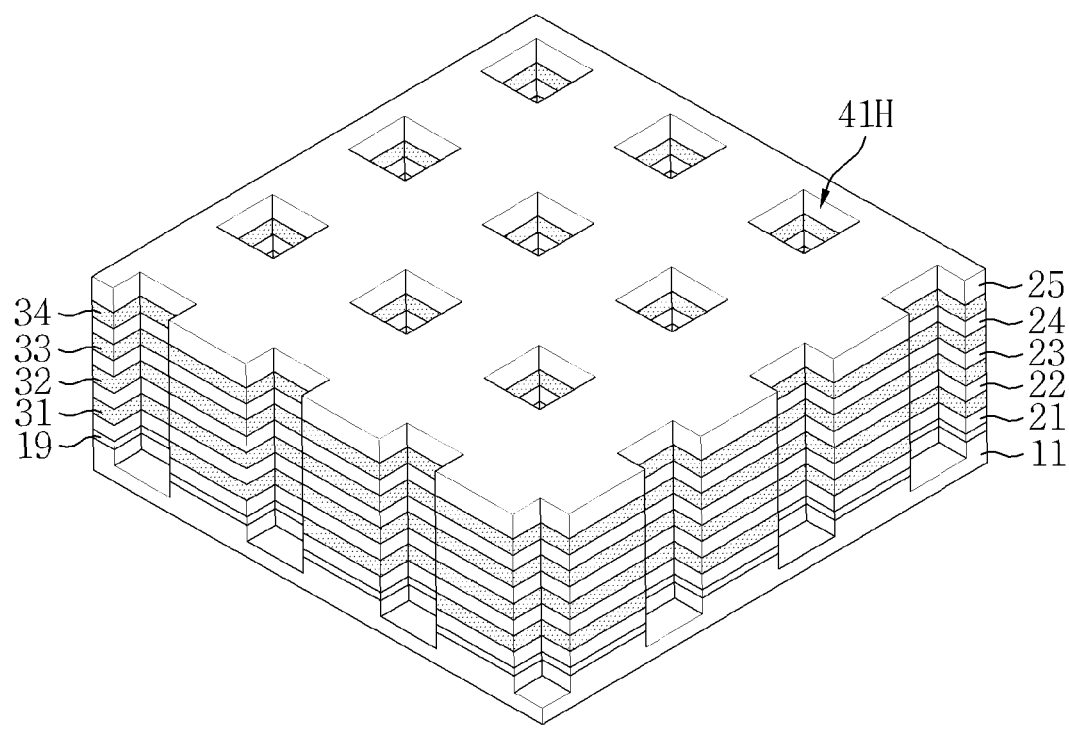
Figure 12:
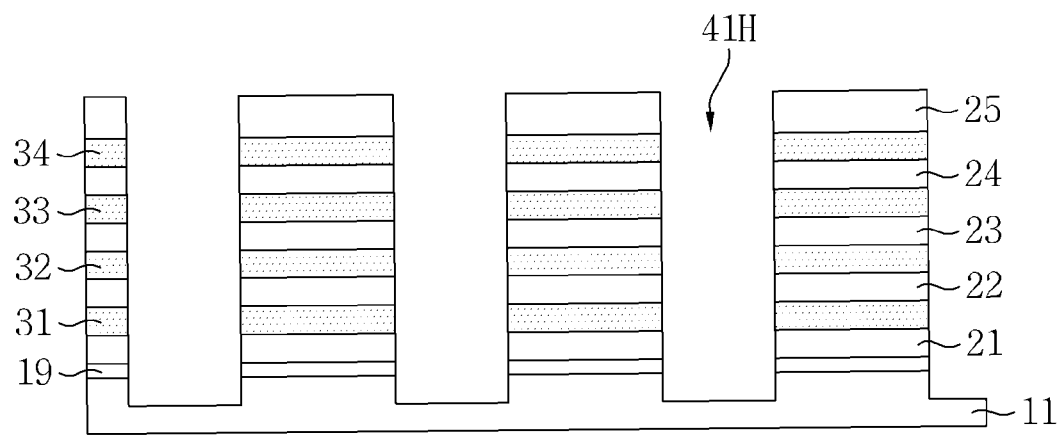

Referring to FIGS. 11 and 12, bit holes 41H are formed through the molding layers 21 through 25, the sacrificial layers 31 through 34, and the substrate buffer layer 19. In general, therefore, the bit holes 41H extend longitudinally orthogonal to a surface of the semiconductor substrate 11. Also, the bit holes 41H may be arrayed 2-dimensionally, i.e., may be arranged in rows and columns. Although the profile of each of the bit holes 41H may have any of various shapes, such as that of an inverted trapezoid that is wider at it upper portion than at its lower portion, for the sake of simplicity each of the bit holes 41H is shown as having a uniform width from top to bottom.

Figure 13:
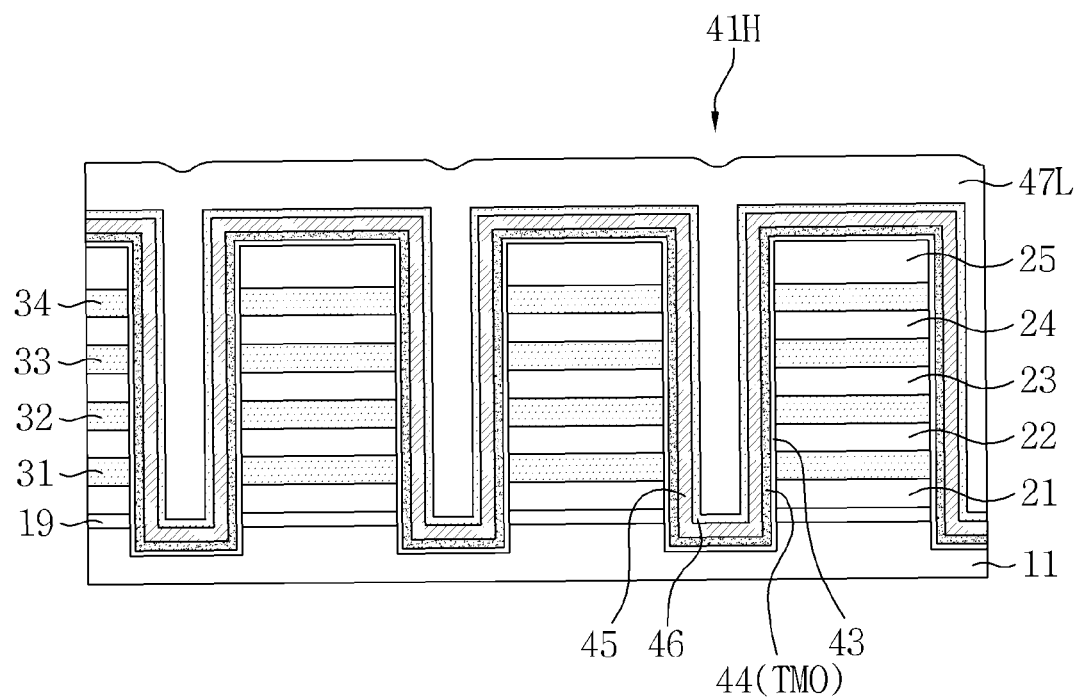
Figure 14:
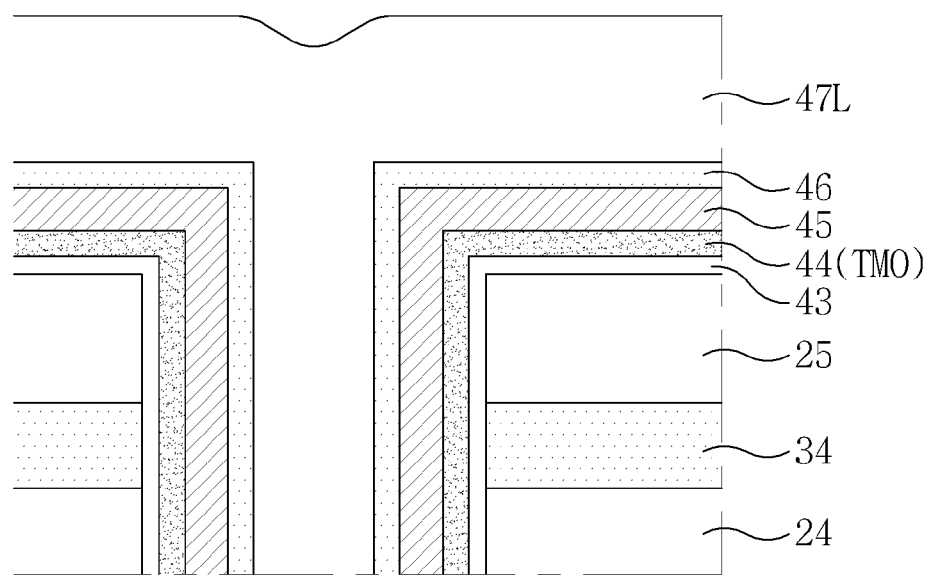

Referring to FIGS. 13 and 14, a buffer layer 43, variable resistance material 44, and an electrode layer 45, are sequentially formed on the substrate 11 so as to extend within each of the bit holes 41H. Then, an etch stop layer 46, and a core layer 47L may be sequentially formed on the electrode layer 45 so as to fill what remains of each of the bit holes 41H.

More specifically, in this example, the buffer layer 43 is conformally formed on the substrate to a constant thickness so as to cover the fifth molding layer 25, and extend along the sides and bottoms of the bit holes 41H. The variable resistance material 44, the electrode layer 45, and the etch stop layer 46 are then conformally formed one atop the other in the foregoing sequence. Then the core layer 47L is formed on the variable resistance material 44 to such a thickness, i.e., as a blanket layer, as to fill what remains of the bit holes 41H, and cover the fifth molding layer 25.

The buffer layer 43 is formed of material having an etch selectivity with respect to the sacrificial layers 31 through 34. For example, when the sacrificial layers 31 through 34 comprise a nitride, the buffer layer 43 may comprise silicon oxide or poly-Si. In another example of this embodiment, the buffer layer 43 is of material having an etch selectivity with respect to the sacrificial layers 31 through 34 and the molding layers 21 through 25. For example, the molding layers 21 through 25 may comprise silicon oxide, the sacrificial layers 31 through 34 may comprise silicon nitride, and the buffer layer 43 may comprise poly-Si.

The variable resistance material 44, as mentioned above, comprises TMO, e.g., is formed of at least one material selected from the group consisting of TiO, TaO, NiO, ZrO, and HfO. The electrode layer 45 may formed of at least one material selected from the group consisting of ruthenium (Ru), W, Ti, TiN, titanium aluminum nitride (TiAlN), titanium silicide (TiSi), TiSiN, Ta, TaN, Hf, and Zr.

The etch stop layer 46 may be formed of material having an etch selectivity with respect to the core layer 47L. For example, the etch stop layer 46 may comprise silicon nitride, while the core layer 47L comprises silicon oxide. In other examples of this embodiment, the etch stop layer 46 and the core layer 47L are of conductive materials, such as a metal, a metal oxide, or a metal nitride. In still another example of this embodiment, the etch stop layer 46 and the core layer 47L are omitted altogether. In this case, the electrode layer 45 fills what remains of the bit holes 41H after the variable resistance material 44 is formed.

Figure 15:
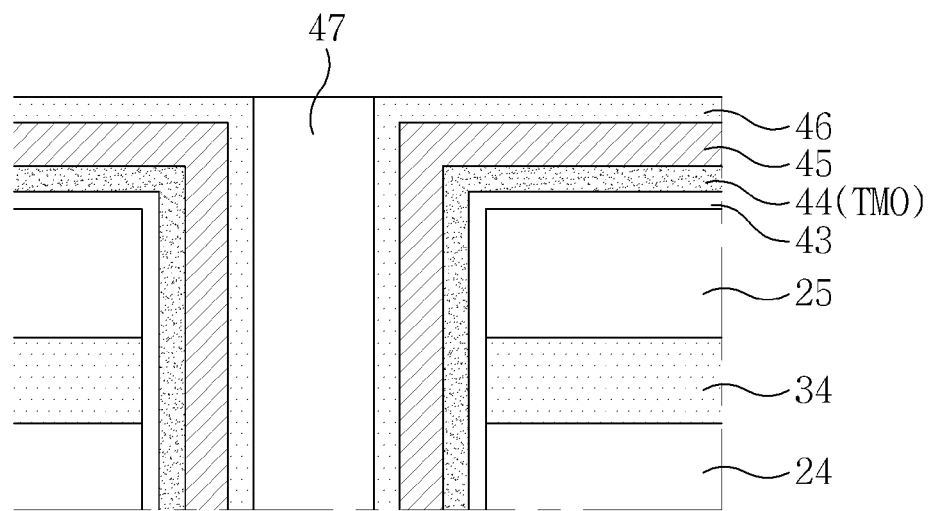

Referring to FIG. 15, the core layer 47L is planarized until the etch stop layer 46 is exposed, thereby forming cores 47. The layer 47L may be planarized by a chemical mechanical polishing (CMP) process and/or an etchback process.

Figure 16:
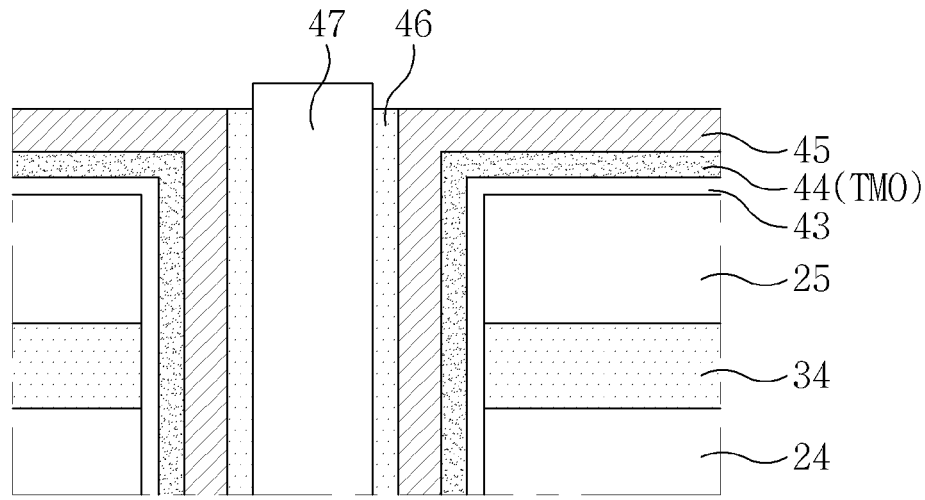

Referring to FIG. 16, part of the etch stop layer 46 may be removed to expose the electrode layer 45. To this end, the etch stop layer 46 may be etched by an anisotropic etching process and/or an isotropic etching process.

Figure 17:
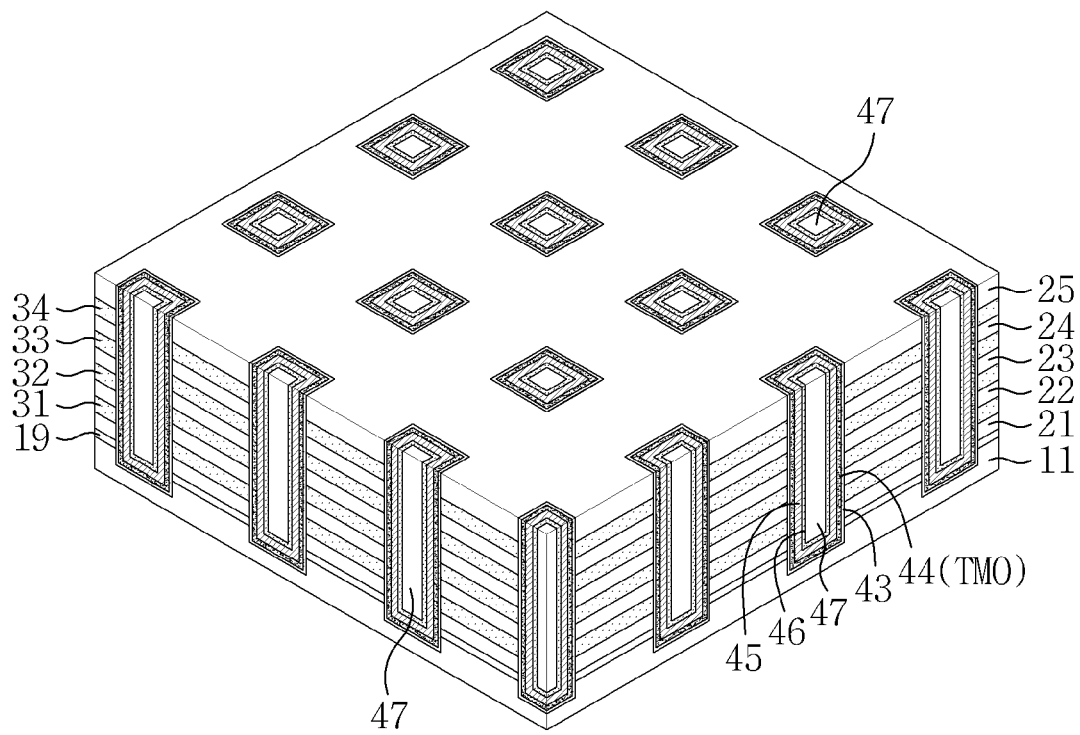
Figure 18:
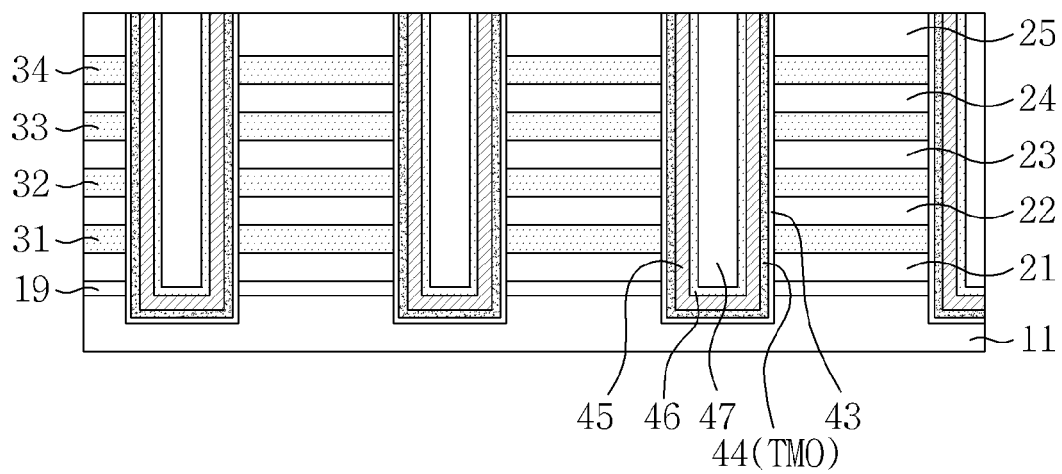
Figure 19:
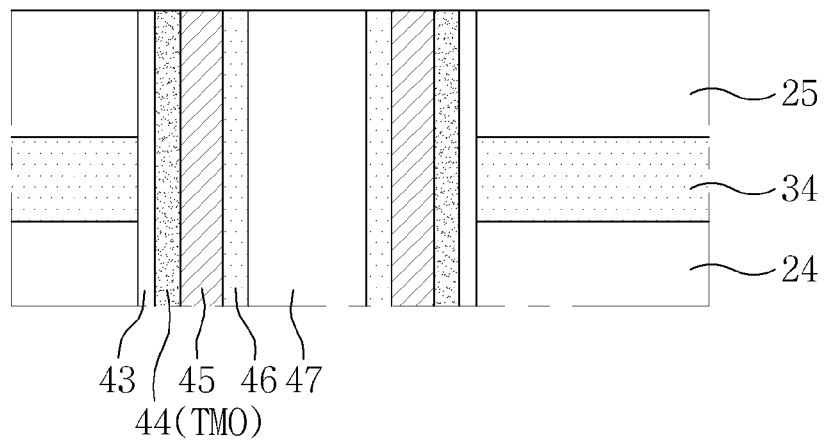

Referring to FIGS. 17 through 19, the resulting structure including the electrode layer 45, the variable resistance material 44, and the buffer layer 43 is planarized to expose the fifth molding layer 25. This planarization process may include a CMP process and/or an etchback process. In another example, the buffer layer 43 is left on the fifth molding layer 25.

In any case, as a result, the cores 47 fill the bit holes 41H, the etch stop layer 46 covers the sidewalls and bottoms of the cores 47, and the electrode layer 45 covers the sidewalls and bottom surface of the etch stop layer 46. The variable resistance material 44 covers the sidewalls and bottom surface of the electrode layer 45, and the buffer layer 43 covers the sidewalls and bottom surface of the variable resistance material 44. The cores 47, the etch stop layer 46, and the electrode layer 45 constitute bit pillars.

Figure 20:
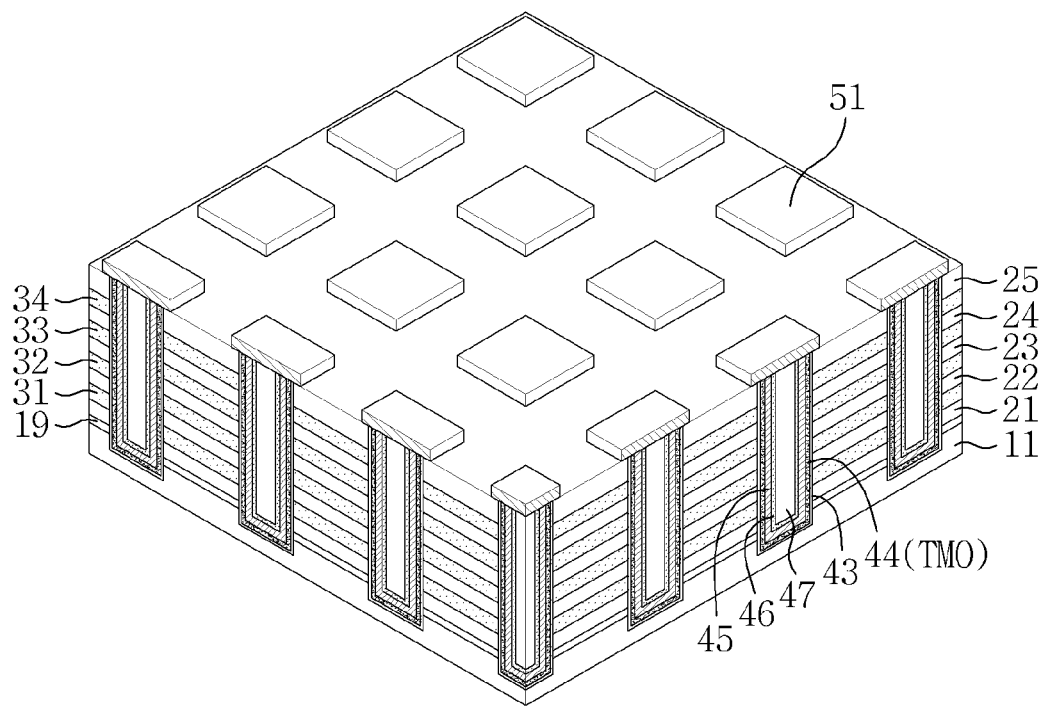
Figure 21:
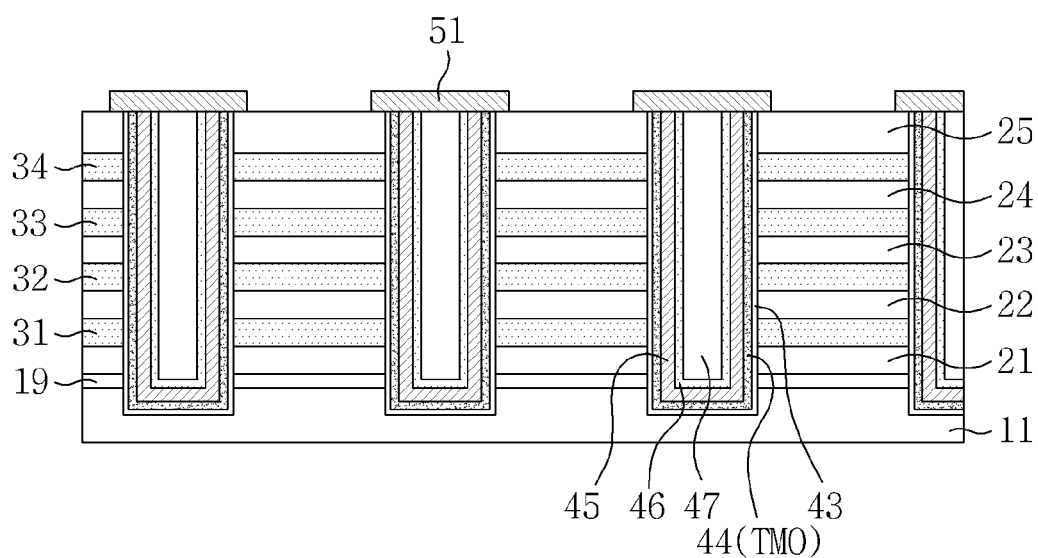

Referring to FIGS. 20 and 21, bit pads 51 are formed on the bit pillars, respectively. The bit pillars 51 may be formed by first forming a thin film of conductive material on the fifth molding layer 25 and then patterning the thin film. The conductive material may be at least one material selected from the group consisting of Ru, W, WN, Ti, TiN, TiAlN, TiSi, TiSiN, Ta, TaN, Hf, abd Zr. In any case, the resulting bit pads 51 contact the electrode layer 45. The bit pads 51 may also be formed to completely cover the cores 47, the etch stop layer 46, the electrode layer 45, the variable resistance material 44, and the buffer layer 43, as shown in the FIGS. 20 and 21.

Figure 22:
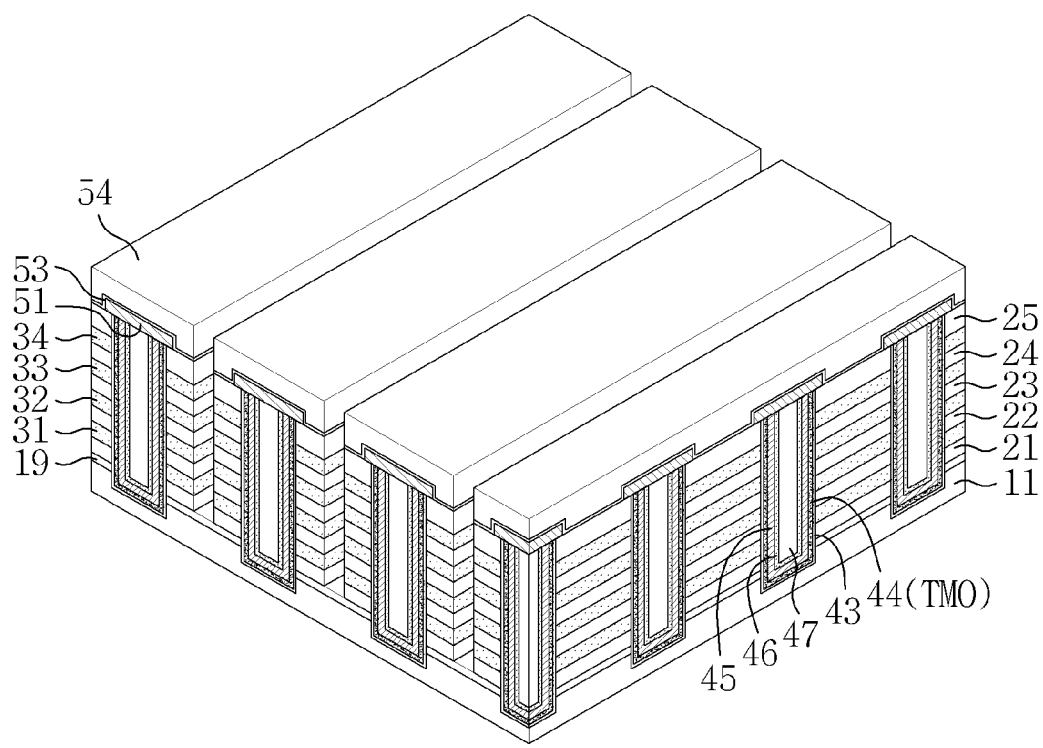
Figure 23:
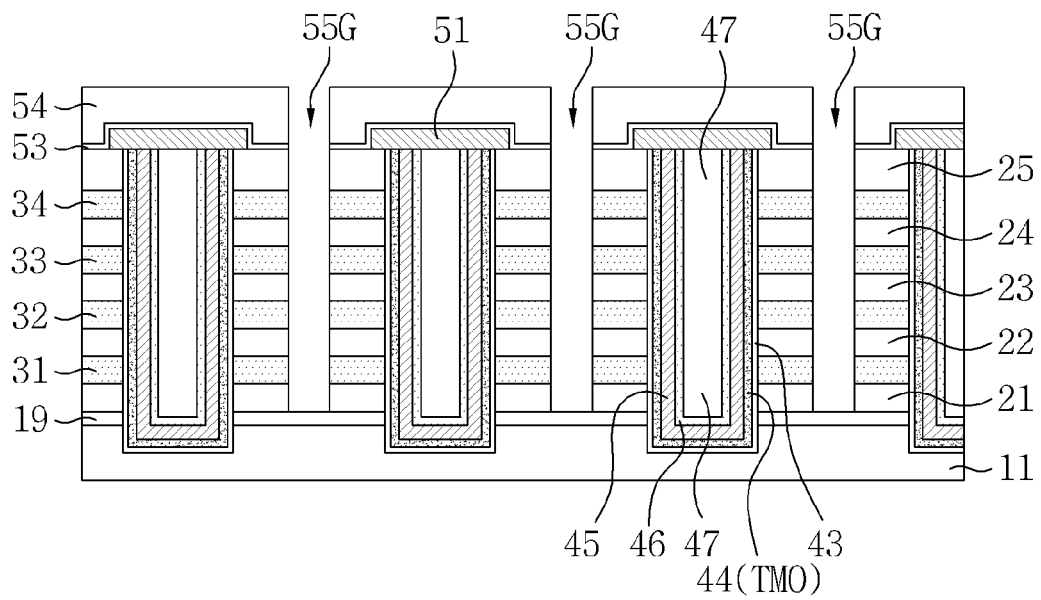

Referring to FIGS. 22 and 23, a first interlayer insulating layer and a second interlayer insulating layer are then sequentially formed on the substrate 11 so as to each cover the bit pads 51 and the fifth molding layer 25. The first interlayer insulating layer may comprise a nitride, such as silicon nitride, whereas the second interlayer insulating layer may comprise an oxide, such as silicon oxide.

The resulting structure is then patterned to form grooves 55G therein and which extend through the second interlayer insulating layer, the first interlayer insulating layer, the molding layers 21 through 25, and the sacrificial layers 31 through 34. The grooves 55G thus expose the sacrificial layers 31 through 34, i.e., form exposed sidewall surfaces of the sacrificial layers 31 through 34. At this time, the remaining portions of the first and second interlayer insulating layers constitute first and second interlayer insulating layers 53 and 54 each covering the bit pads 51.

Figure 24:
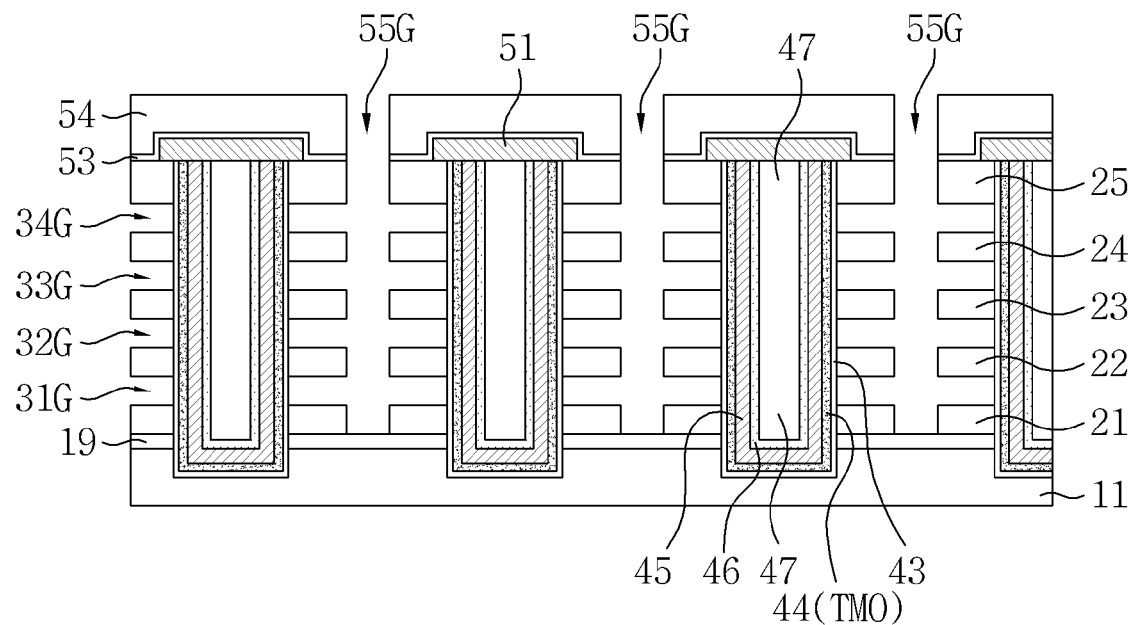

Referring to FIG. 24, the sacrificial layers 31 through 34 are then removed to form slits 31G, 32G, 33G, and 34G between the molding layers 21 through 25. In this respect, the sacrificial layers 31 through 34 are removed by a pull-back process, such as an isotropic etching process. At this time, the buffer layer 43 may be exposed by the slits 31G through 34G. The buffer layer 43 prevents the variable resistance material 44 and the electrode layer 45 from being damaged by the etchant used to remove the sacrificial layers 31 through 34.

Figure 25:
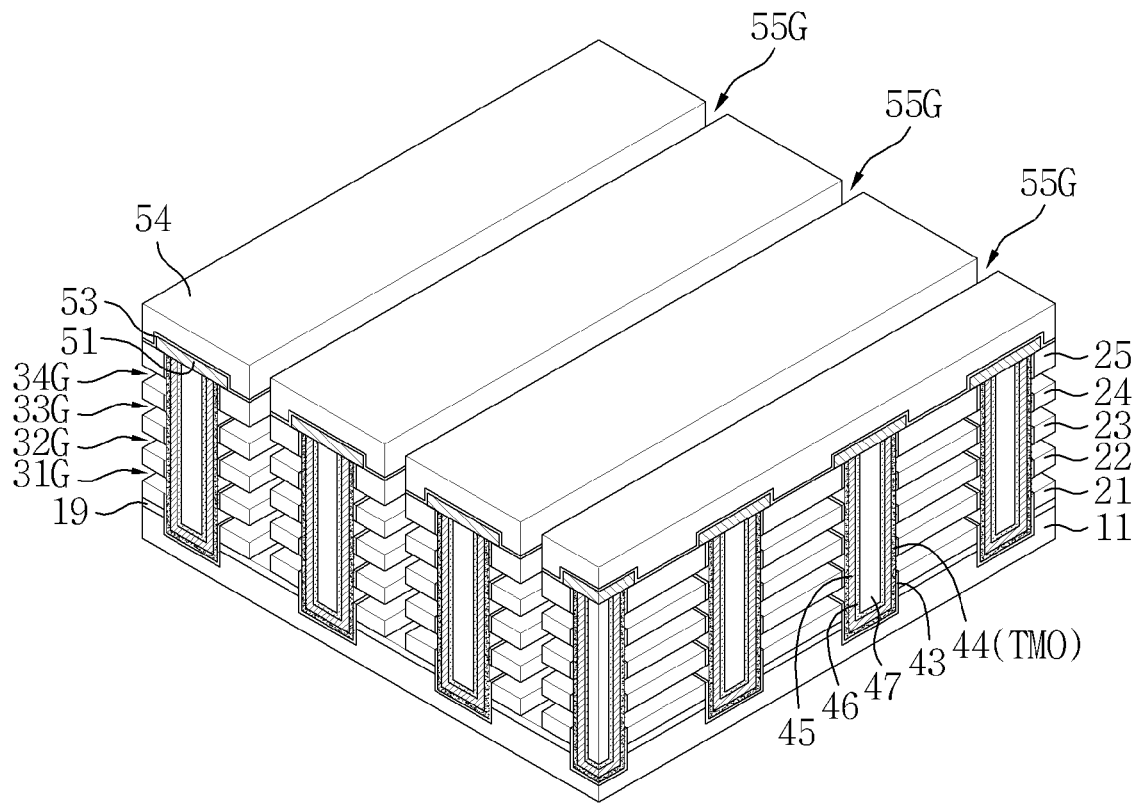
Figure 26:
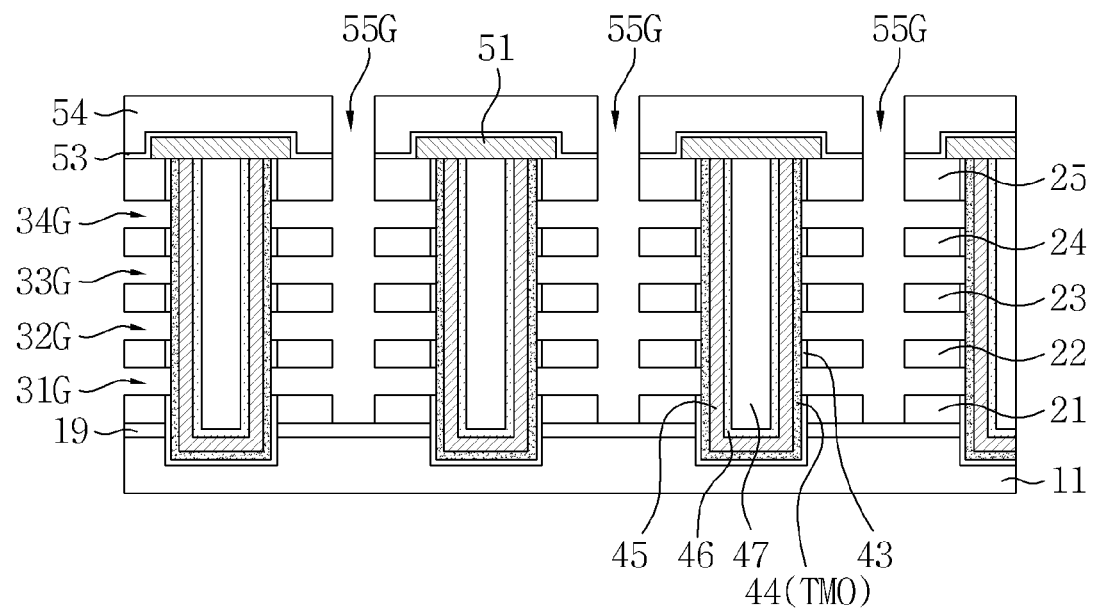
Figure 27:
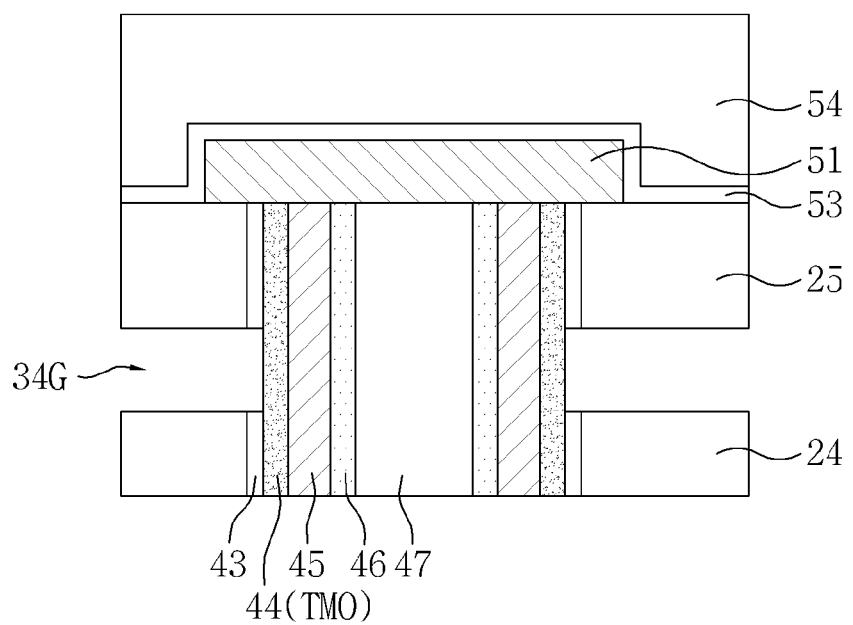

Referring to FIGS. 25 through 27, the portions of the buffer layer 43 exposed by the slits 31G through 34G are removed to thereby, in turn, expose portions of the variable resistance material 44.

Figure 28:
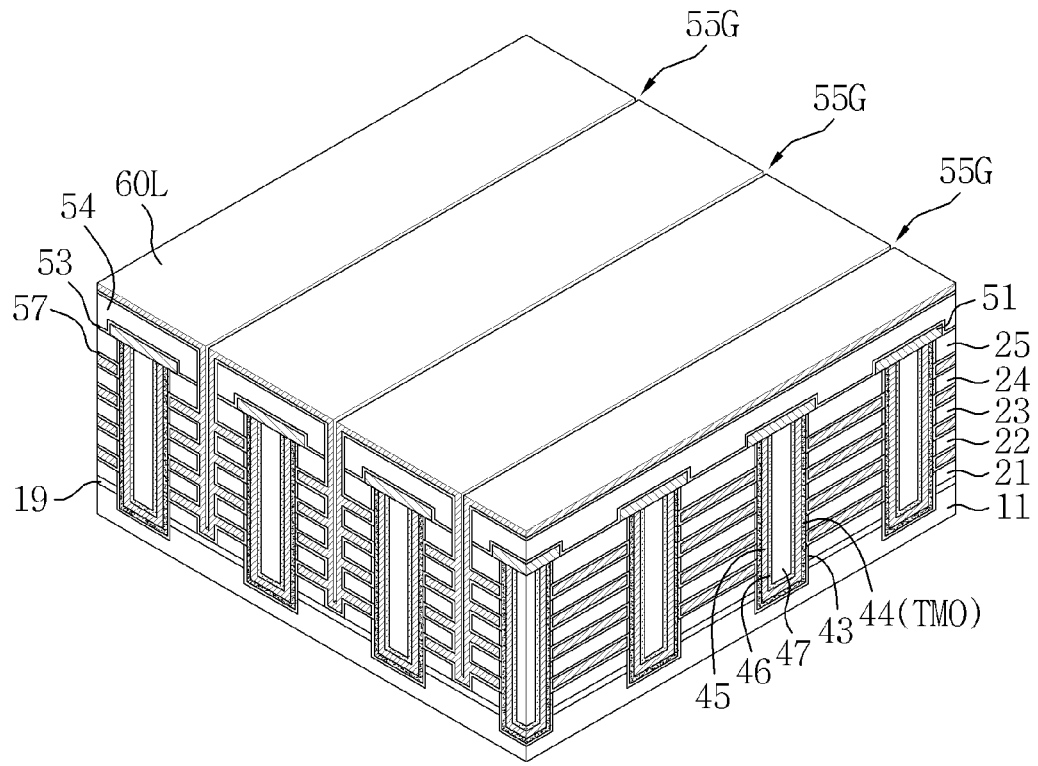
Figure 29:
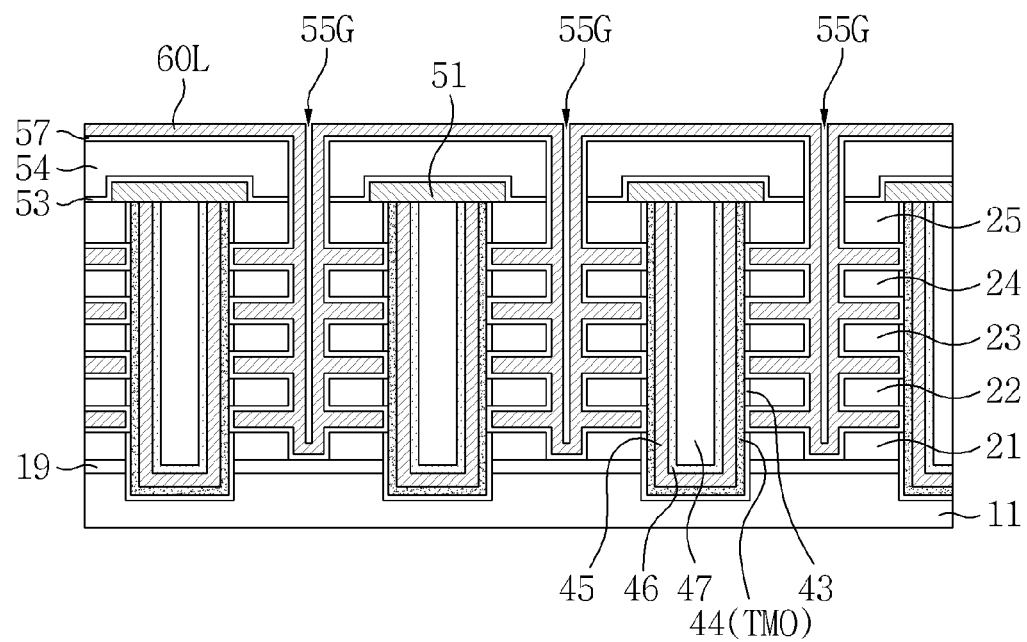
Figure 30:
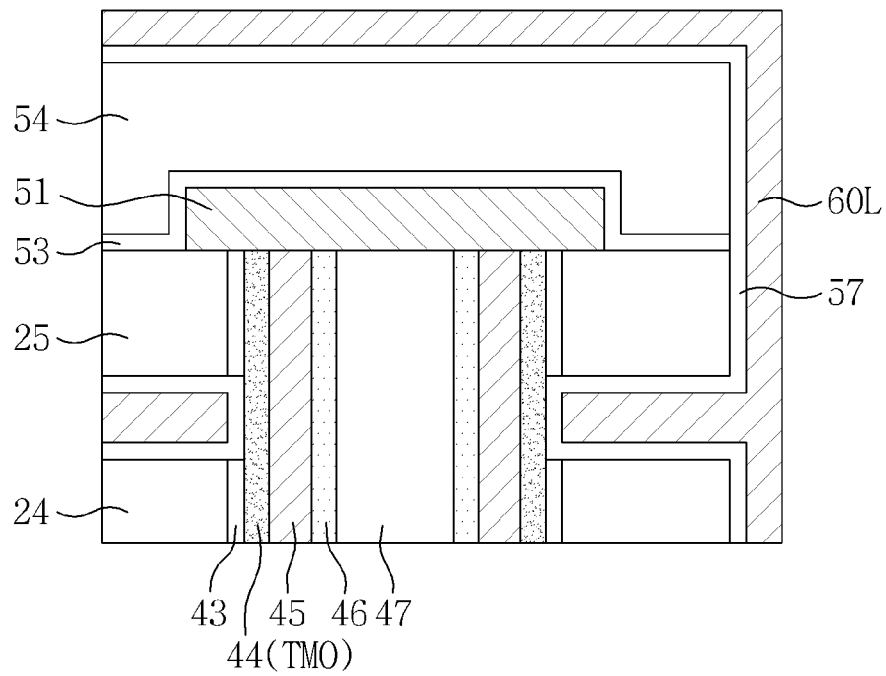

Referring to FIGS. 28 through 30, a diode layer 57 and a word conductive layer 60L are sequentially formed within the slits 31G through 34G and the first grooves 48G. As was mentioned above, the diode layer 57 may be formed of metal oxide having a composition different from that of the variable resistance material 44. For example, the diode layer 57 may be formed of at least one metal oxide selected from the group consisting of TiO, NiO, HfO, AlO, ZrO, ZnO, TaO, NbO, and WO. The word conductive layer 60L may be formed of Ru, W, WN, Ti, TiN, TiAlN, TiSi, TiSiN, Ta, TaN, Hf, or Zr. Alternatively, the diode layer 57 may be formed of a metal silicide or a metal. In this case, the word conductive layer 60L may be formed of poly-Si.

In any case, in the illustrated example, the word diode layer 57 is conformally formed and then the conductive layer 60L is formed to such a thickness as to at least fill what remains of the slits 31G through 34G. The word conductive layer 60L may also be formed to such a thickness that is merely extends along the sides of the grooves 55G, i.e., without filling the grooves 55G completely, as shown in the figures.

Figure 31:
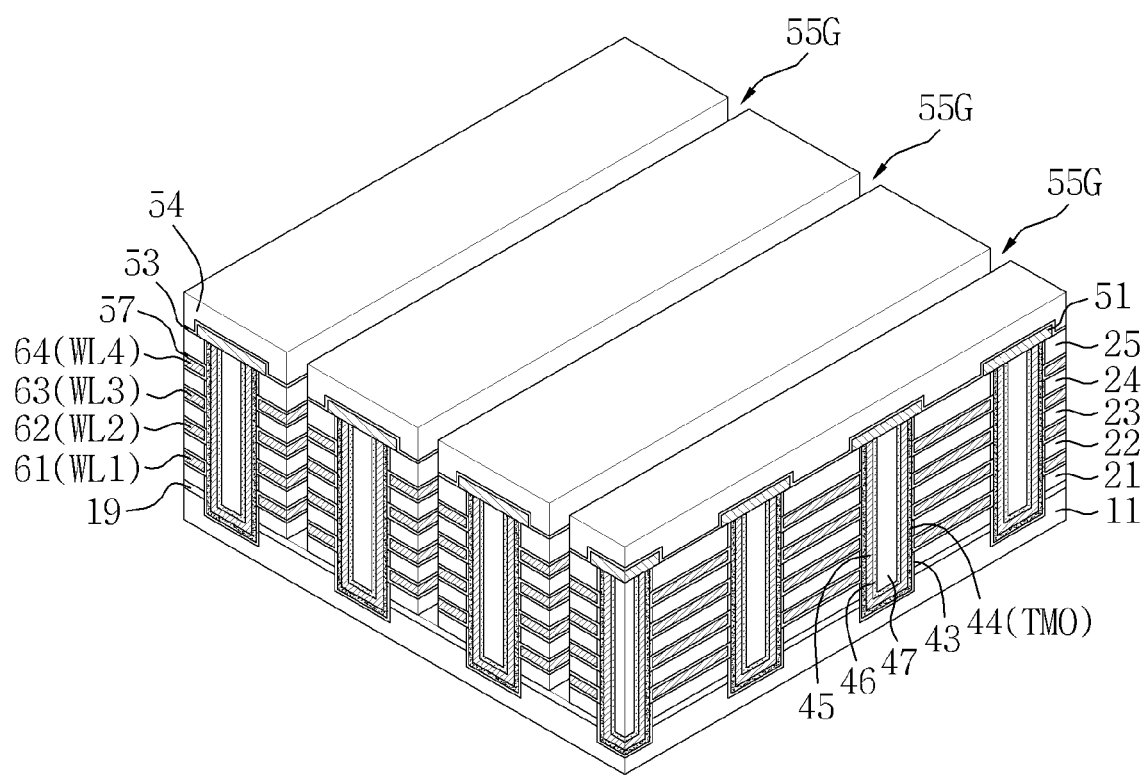
Figure 32:
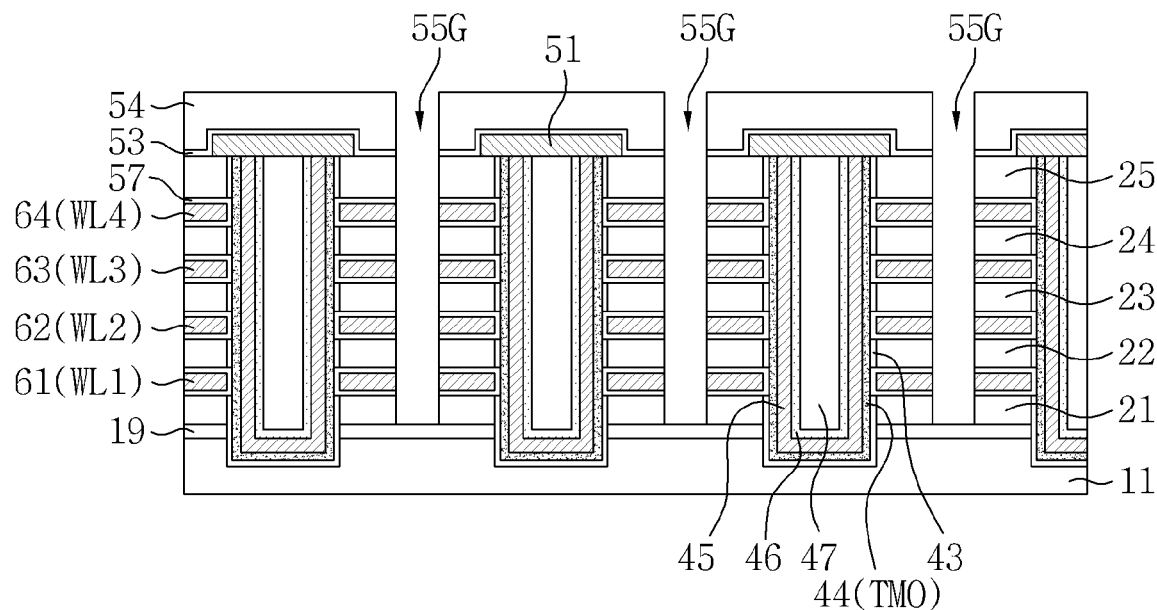
Figure 33:
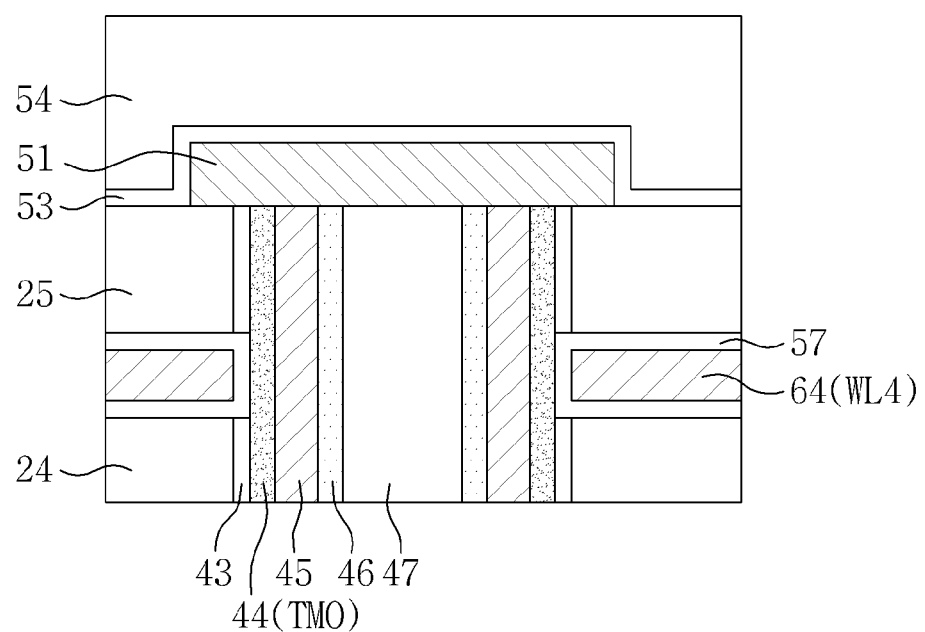

Referring to FIGS. 31 through 33, a portion of the word conductive layer 60L is removed to form word lines WL1 through WL4 within the slits 31G through 34G. More specifically, the word conductive layer 60L may be trimmed from the grooves 55G to form the word lines WL1 through WL4. This trimming process may also divide the diode layer into a plurality of segments. Each segment of the diode layer 57 is interposed between a word line 61 through 64 and the variable resistance material 44. In any case, the resulting word lines 61 through 64, the diode layer 57, and the molding layers 21 through 25 are exposed by the grooves 55G.

Figure 34:
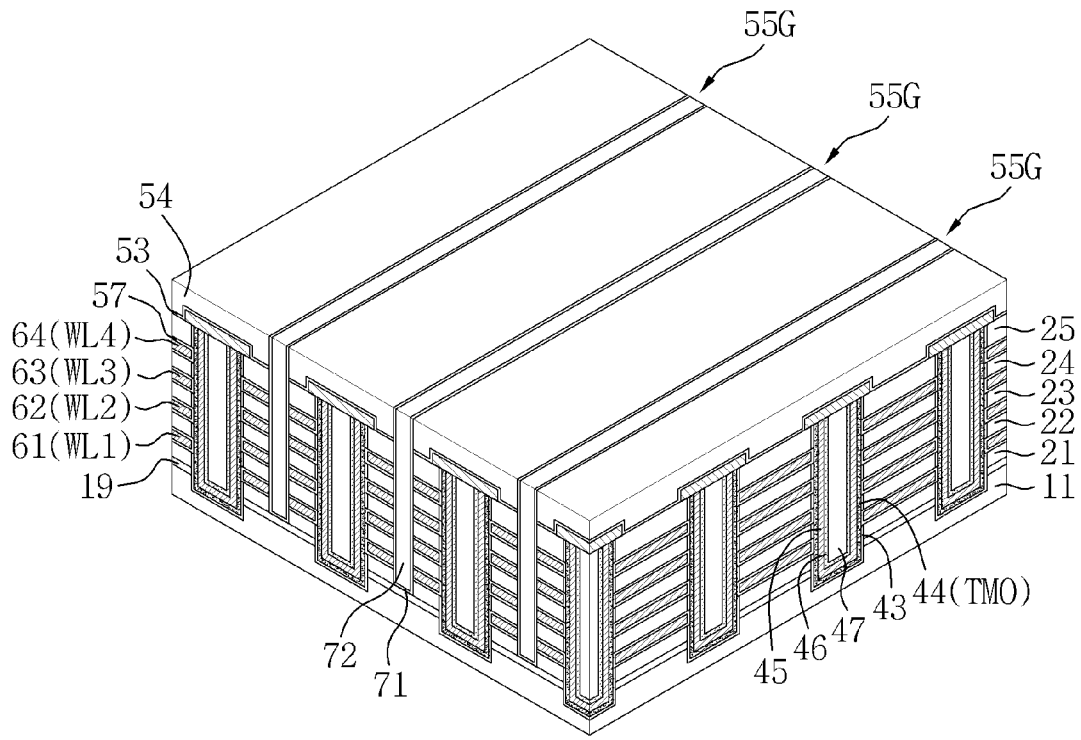
Figure 35:
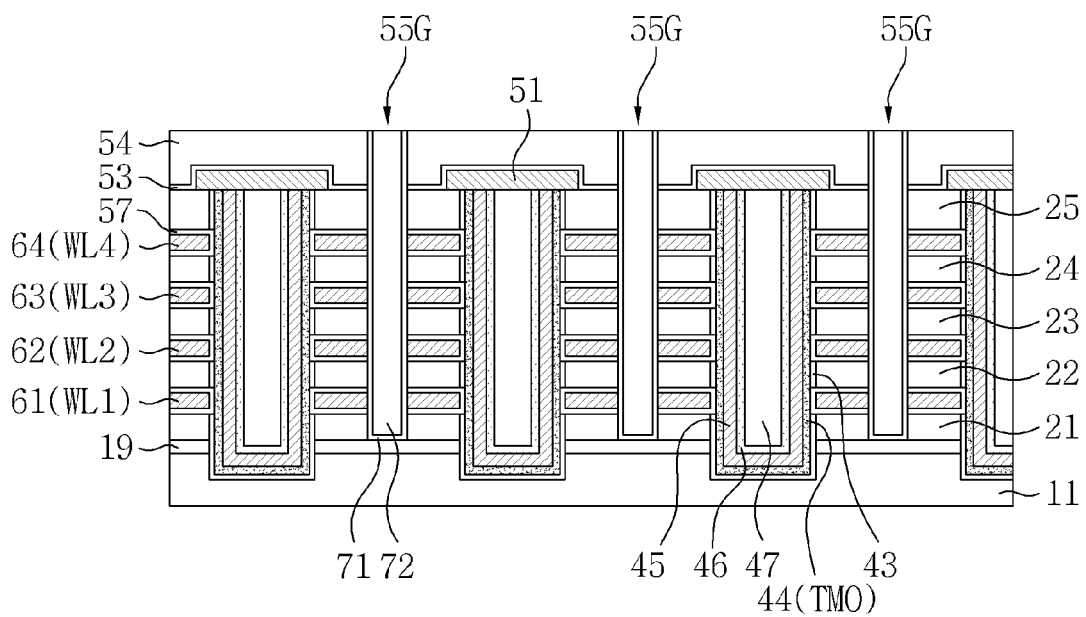
Figure 36:
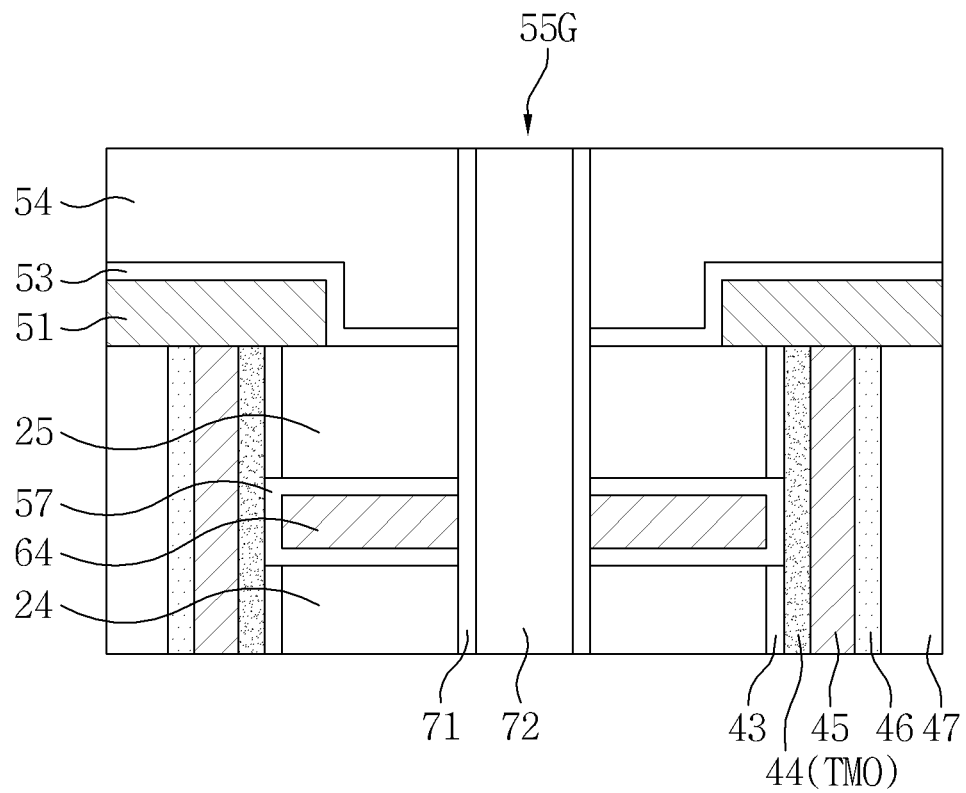

Referring to FIGS. 34 through 36, a third interlayer insulating layer 71 and a fourth interlayer insulating layer 72 are sequentially formed within the grooves 55G. The third interlayer insulating layer 71 may be formed of a nitride, such as silicon nitride, whereas the fourth interlayer insulating layer 72 may be formed of an oxide, such as silicon oxide. The third and fourth interlayer insulating layers 71 and 72 may be formed by conformally forming a thin film on the structure containing the grooves 55G to line the grooves 55G and cover the second interlayer insulating layer 54, forming a blanket layer to such a thickness as to fill what remains of the grooves 55G and cover the conformal thin film, and then planarizing the resulting structure until the second interlayer insulating layer 54 is exposed. Alternatively, the third and fourth interlayer insulating layers 71 and 72 may left on the second interlayer insulating layer 54.

Referring back to FIGS. 1A and 2, bit plugs 85 may then be formed through the second and first interlayer insulating layers 54 and 53, and contact the bit pads 51. Then bit lines 87 may be formed on the second through fourth interlayer insulating layers 54, 71, and 72 as disposed in contact with the bit plugs 85.

In the method described above, according to the inventive concept, the buffer layer 43 prevents the variable resistance material 44 and the electrode layer 45 from being damaged by the etching process used to remove the sacrificial layers 31 through 34. Thus, a non-volatile memory device having good electrical properties may be fabricated.

Another embodiment of a method of fabricating a non-volatile memory device according to the inventive concept will be described in detail with reference to FIGS. 37 through 42. However, a detailed description of those steps and/or processes which are obviously similar to those described above will be omitted for the sake of brevity.

Figure 37:
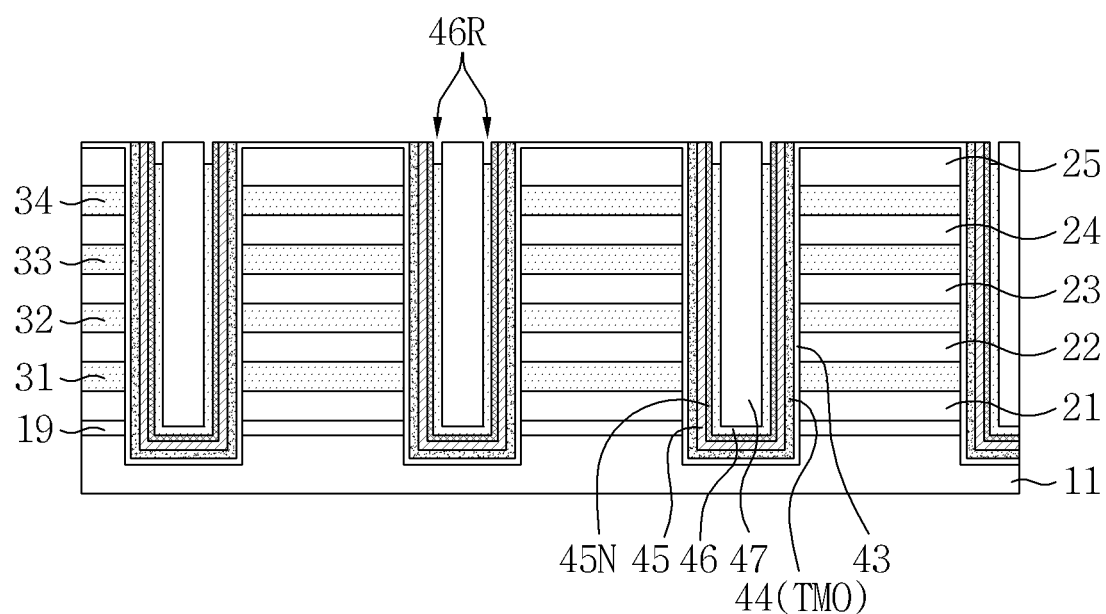
Figure 38A:
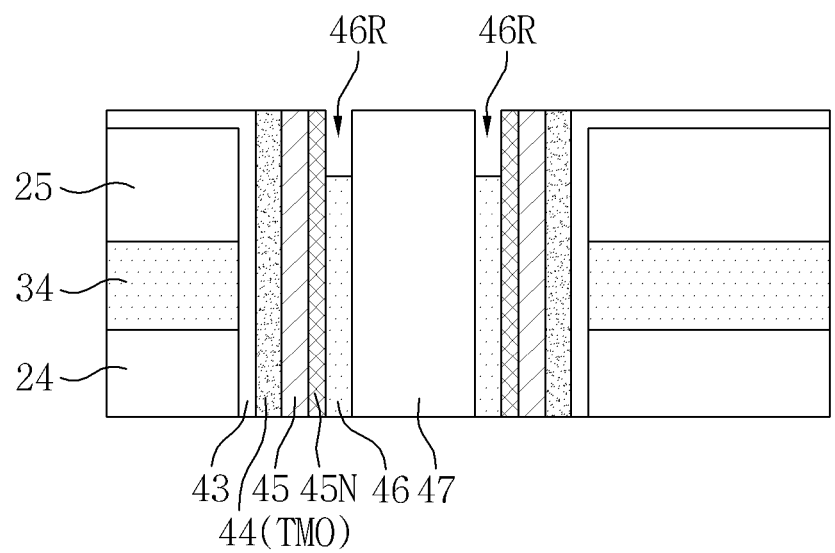

Referring to FIGS. 37 and 38A, a buffer layer 43, variable resistance material 44, an electrode layer 45, an N-rich electrode layer 45N, an etch stop layer 46, and cores 47 are formed. In this regard, the buffer layer 43 is formed to cover and is left on a top surface of the fifth molding layer 25. Also, the cores 47, the etch stop layer 46, the N-rich electrode layer 45N, and the electrode layer 45 constitute bit pillars.

The etch stop layer 46 is formed of material having an etch selectivity with respect to the cores 47. For example, the etch stop layer 46 may be formed of a nitride, such as silicon nitride. During the formation of the etch stop layer 46, the electrode layer 45 is exposed to a nitrogen ($N_2$) atmosphere. Accordingly, the N-rich electrode layer 45N is formed on the electrode layer 45.

The etch stop layer 46 is then isotropically etched to form a recess 46R in the top of the resulting structure. Upper parts of the side surfaces of the N-rich electrode layer 45N are exposed by the recess 46R.

Figure 38B:
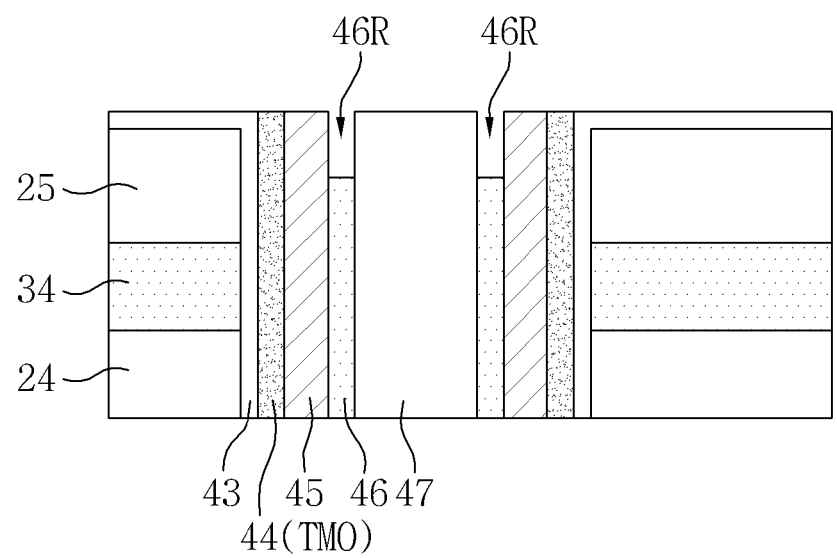

FIG. 38B shows an example of this embodiment in which the N-rich electrode layer 45N is not formed. In this case, the upper part of the electrode layer 45 is exposed by the recess 46R.

Figure 38C:
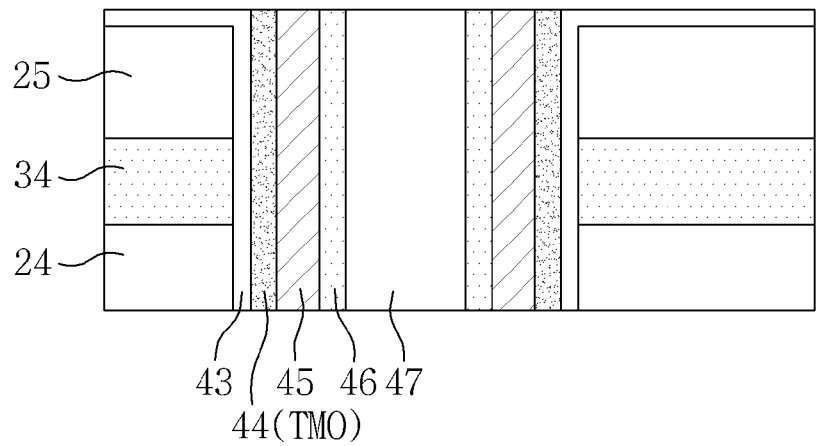

FIG. 38C shows an example in which the etch stop layer 46 is not etched to expose the upper part of the electrode layer 45. In this case, top end surfaces of the buffer layer 43, the variable resistance material 44, the electrode layer 45, the etch stop layer 46, and the cores 47 are substantially coplanar.

Figure 39:
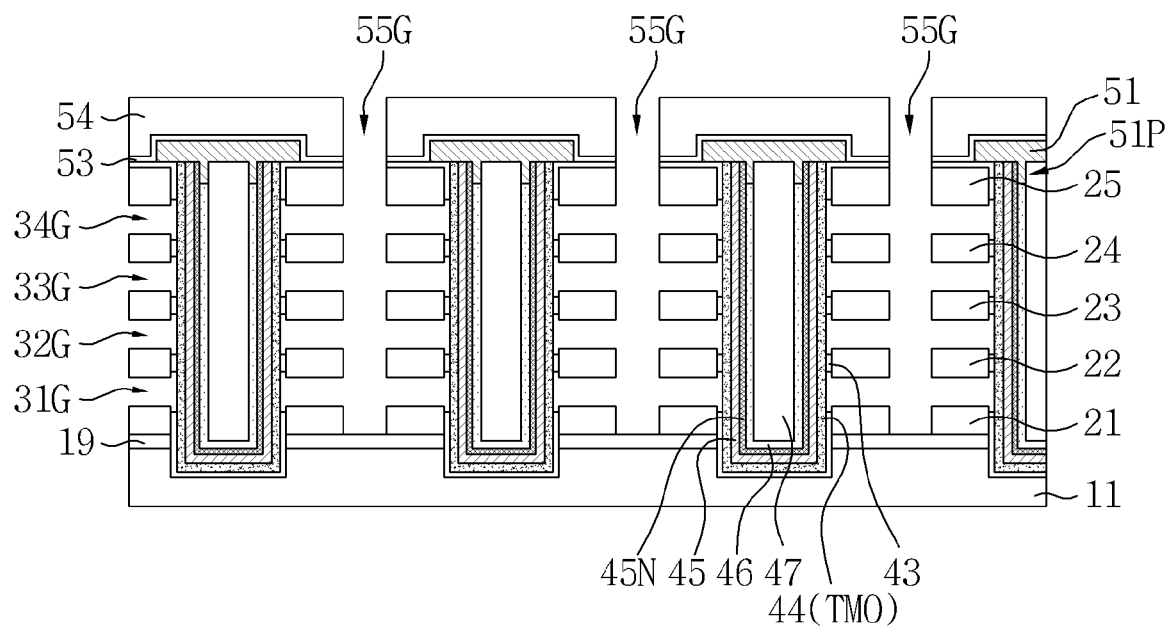
Figure 40A:
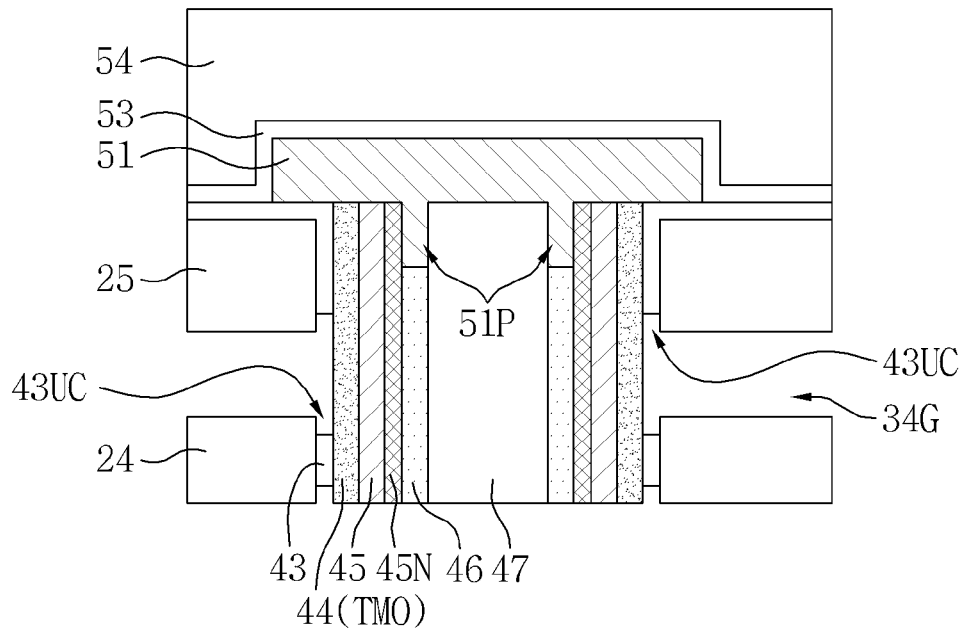

Referring to FIGS. 39 and 40A, bit pads 51 are formed on the fifth molding layer 25 and the buffer layer 43 to cover the bit pillars, in a manner similar to that described with reference to 20 and 21. However, in this case, owing to the recesses 46R, protrusions 51P of the bit pads 51 form within the recesses 46R. In this example, the protrusions 51P contact the inner sidewall surfaces of the N-rich electrode layer 45N.

Next, a first interlayer insulating layer 53 and a second interlayer insulating layer 54 are sequentially formed to cover the bit pads 51 and the buffer layer 43. Grooves 55G are then formed in the resulting structure to such a depth as to penetrate the second and first interlayer insulating layers 54 and 53, the buffer layer 43, the molding layers 21 through 25, and the sacrificial layers 31 through 34. As was mentioned above, the sacrificial layers 31 through 34 are exposed by the grooves 55G The sacrificial layers 31 through 34 are then removed to form slits 31G through 34G between the molding layers 21 through 25. Subsequently, part of the buffer layer 43 is removed to expose the variable resistance material 44. The partial removal of the buffer layer 43 may result in an overetching of the buffer layer due to the process margin. In this case, undercut regions 43UC are formed between the molding layers 21 through 25 and the variable resistance material 44.

Figure 40B:
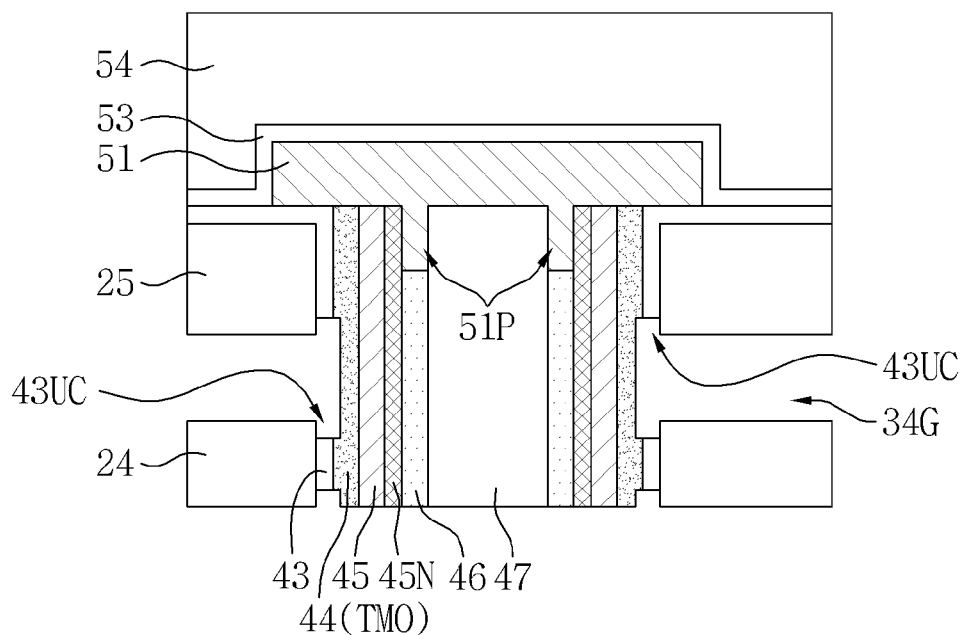

Referring to FIG. 40B, the variable resistance material 44 may also be partially etched during the partial removal of the buffer layer 43.

In any case, the buffer layer 43 serves to prevent the variable resistance material 44 and the electrode layer 45 from being damaged during the removal of the sacrificial layers 31 through 34. Also, the variable resistance material 44 still is effective, i.e., will properly assume its high and low resistance states, even if the undercut regions 43UC are formed. In addition, the buffer layer 43 ensures that the undercut regions 43UC are uniform throughout the device.

Figure 41:
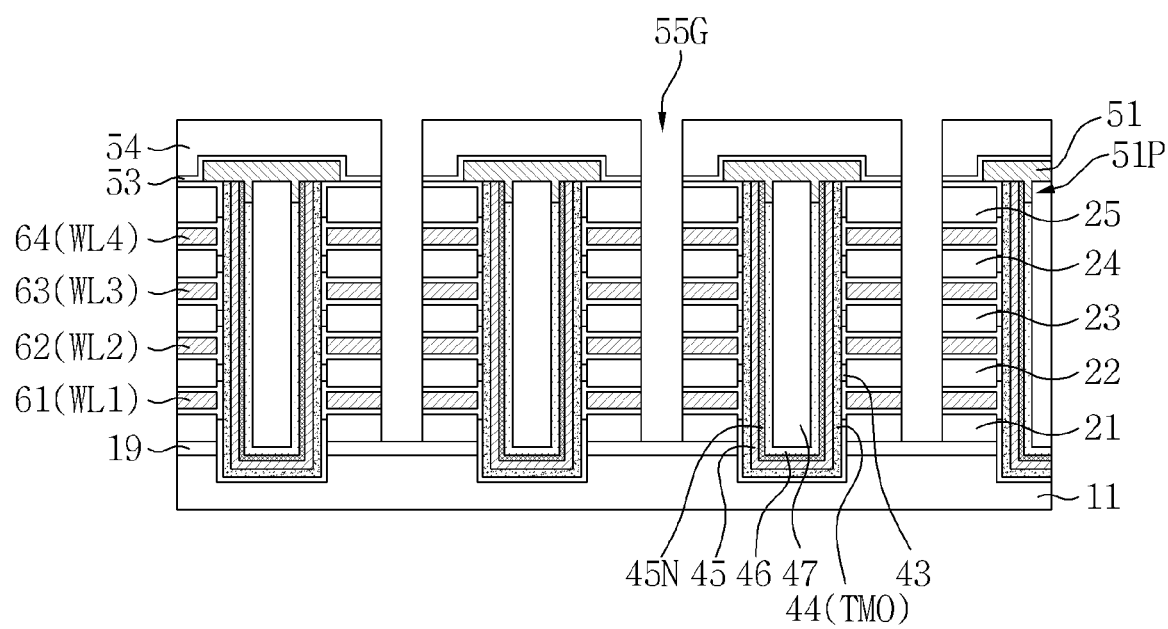
Figure 42:
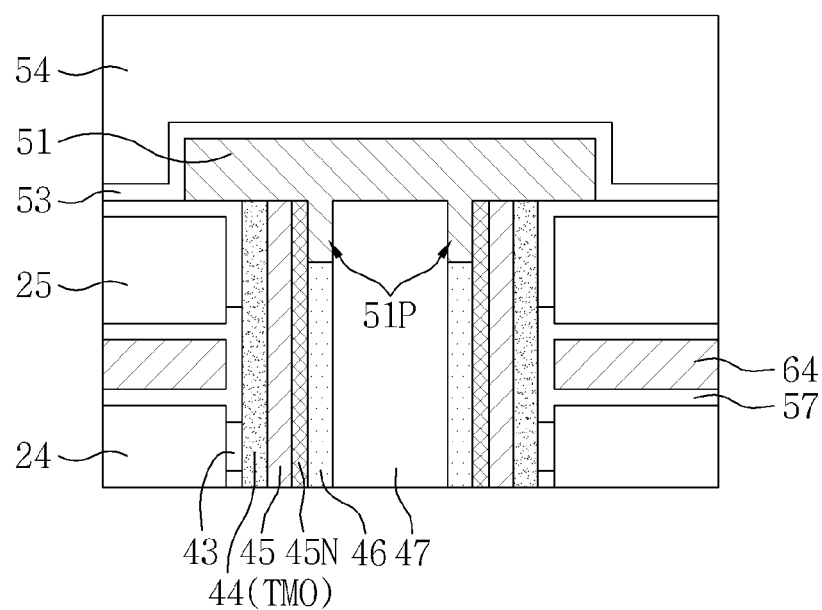

Referring to FIGS. 41 and 42, a diode layer 57 and word lines WL1 through WL4 are then formed within the slits 31G through 34G. The diode layer 57 fills the undercut regions 43UC, if they are formed, and covers top and bottom surfaces of the word lines WL1 through WL4. As was described with reference to FIGS. 31 and 32, this entails a trimming process in which grooves 55G are formed in the structure.

Referring back to FIGS. 4 and 5A, a third interlayer insulating layer 71 and a fourth interlayer insulating layer 72 are then sequentially formed within the grooves 55G. Bit plugs 85 may then be formed through the second and first interlayer insulating layers 54 and 53 as disposed in contact with the bit pads 51, respectively. Bit lines 87 may then be formed on the second through fourth interlayer insulating layers 54, 71, and 72 as disposed in contact with the bit plugs 85.

FIGS. 43 through 47 illustrate essential steps in still another embodiment of a method of fabricating a non-volatile memory device according to the inventive concept.

Referring to FIGS. 43 and 44, a substrate buffer layer 19, a plurality of molding layers 21, 22, 23, 24, and 25, and a plurality of sacrificial layers 31, 32, 33, and 34 are formed on a semiconductor substrate 11. Bit holes 41H are then formed through the molding layers 21 through 25, the sacrificial layers 31 through 34, and the substrate buffer layer 19. A buffer layer 43, an electrode layer 45, an etch stop layer 46, and a core layer 47L are then sequentially formed within the bit holes 41H. The buffer layer 43 may be in contact with sidewall surfaces of the sacrificial layers 31 through 34 and the molding layers 21 through 25, as well as an upper surface of the fifth molding layer 25.

Figure 46:
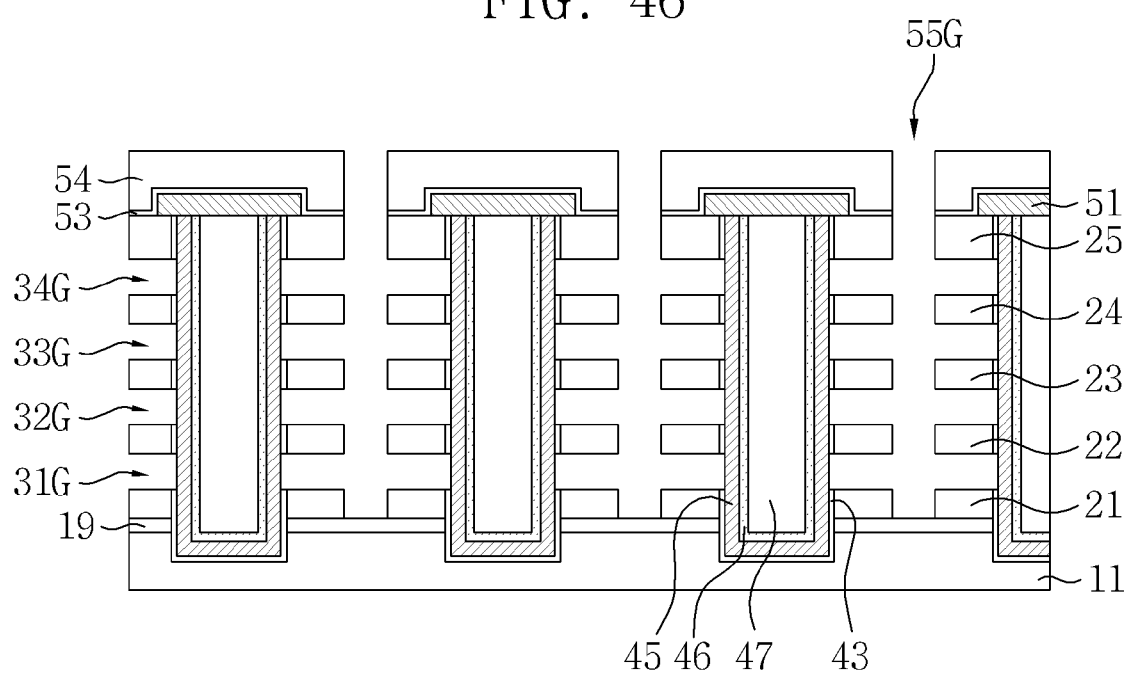
Figure 47:
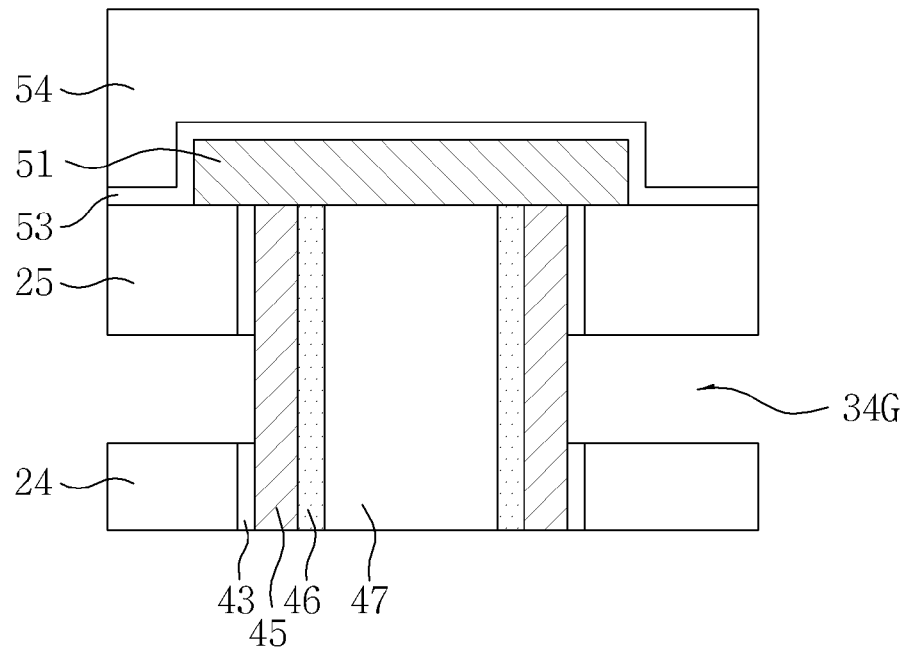

Referring to FIGS. 45 through 47, the resulting structure is planarized, beginning at the core layer 47L and until the fifth molding layer 25 is exposed. As a result, cores 47, and (remnants of) the etch stop layer 46, the electrode layer 45, and the buffer layer 43 are formed/retained within the bit holes 41H. In this case, the cores 47, the etch stop layer 46, and the electrode layer 45 constitute bit pillars.

Bit pads 51 are formed on the fifth molding layer 25 as covering the bit pillars, respectively. A first interlayer insulating layer 53 and a second interlayer insulating layer 54 are then sequentially formed on the bit pads 51 and the fifth molding layer 25. Next, grooves 55G are formed in the structure to such a depth as to penetrate the second and first interlayer insulating layers 54 and 53, the molding layers 21 through 25, and the sacrificial layers 31 through 34. The sacrificial layers 31 through 34 are then etched away to form slits 31G through 34G between the molding layers 21 through 25. The buffer layer 43 prevents the electrode layer 45 from being damaged by the etching process used to remove the sacrificial layers 31 through 34.

Next, a portion of the buffer layer 43 is removed to expose the electrode layer 45. The remaining segments of the buffer layer 43 are retained between the molding layers 21 through 25 and the electrode layer 45 and each surround the electrode layer 45.

Referring back to FIGS. 6A, 6B, and 7A, variable resistance material 44, a diode layer 57, and word lines WL1 through WL4 are sequentially formed within the slits 31G through 34G. A third interlayer insulating layer 71 and a fourth interlayer insulating layer 72 are then sequentially formed within the grooves 55G Next, bit plugs 85 are formed to extend through the second and first interlayer insulating layers 54 and 53 and contact the bit pads 51, respectively. Bit lines 87 are then formed on the second through fourth interlayer insulating layers 54, 71, and 72 as disposed in contact with the bit plugs 85.

FIGS. 48 through 50 illustrate essential steps in still another embodiment of a method of fabricating a non-volatile memory device according to the inventive concept.

Referring to FIG. 48, a buffer layer 43P of poly-Si, molding layers 21, 22, 23, 24, and 25 of silicon oxide, and sacrificial layers 31, 32, 33, and 34 of silicon nitride are formed on a substrate 11. Grooves 55G are formed in the resulting structure through the second and first interlayer insulating layers 54 and 53, the molding layers 21 through 25, and the sacrificial layers 31 through 34. The sacrificial layers 31 through 34 are exposed by the grooves 55G. The sacrificial layers 31 through 34 are then removed by a pull-back process, such as an isotropic etching process, to form slits 31G through 34G between the molding layers 21 through 25. Portions of the buffer layer 43P are exposed by the slits 31G through 34G.

The buffer layer 43P prevents variable resistance material 44 and electrode layer 45 from being damaged due to the pull-back process used to remove the sacrificial layers 31 through 34.

Referring to FIGS. 49 and 50, the exposed portions of the buffer layer 43P are converted into a diode layer 57S by a silicidation process. The diode layer 57S may comprise a metal silicide. The other segments of the buffer layer 43P are retained between the variable resistance material 44 and the molding layers 21 through 25. This process by which the exposed portions of the buffer layer 43P are silicided will be described in more detail below.

First, a metal layer 57M and a capping layer 57MC are sequentially formed on the structure so as to line the slits 31G through 34G. The metal layer 57M may be in contact with the exposed segments of the buffer layer 43P. A reaction is facilitated between the metal layer 57M and the exposed segments of the buffer layer 43P to silicide portions of the buffer layer 43P. For example, this silicidation process may be an annealing of the metal layer 57M and the exposed buffer layer 43P.

Subsequently, the capping layer 57MC and the metal layer 57M may be removed.

Referring back to FIGS. 8A and 8B, word lines W11 through WL4 are formed within the slits 31G through 34G. The word lines WL1 through WL4 may be formed of a semiconductor material, such as poly-Si. A third interlayer insulating layer 71 and a fourth interlayer insulating layer 72 are then sequentially formed within the grooves 55G. Bit plugs 85 may then formed through the second and first interlayer insulating layers 54 and 53 and in contact with the bit pads 51, respectively. Bit lines 87 may then be formed on the second through fourth interlayer insulating layers 54, 71, and 72 as disposed in contact with the bit plugs 85.

An embodiment of an electronic system according to the inventive concept will now be described with reference to FIG. 51. The electronic system will be described in the context of a data storage device, such as a solid-state drive (SSD) 1011. SSDs are widely used in laptops (laptop PCs), desktop PCs, MP3 players, and various other portable information storage devices. As compared with hard disk drives (HDDs), SSDs operate at a high speed, fail at a small rate, generate low amounts of heat and noise, and are small in scale so as to be lightweight, etc.

Referring to FIG. 51, the SSD 1011 of this example includes an interface 1013, a controller 1015, a non-volatile memory device 1018, and a buffer memory 1019.

The controller 1015 is disposed adjacent to and is electrically connected to the interface 1013. The controller 1015 may be a microprocessor (MP) including a memory controller and a buffer controller. The non-volatile memory device 1018 is disposed adjacent to and is electrically connected to the controller 1015 through a connection terminal T. The SSD 1011 may have a data capacity corresponding to that of the non-volatile memory device 1018. The buffer memory 1019 is disposed adjacent to and is electrically connected to the controller 1015.

The interface 1013 may be connected to a host 1002 and serves to transmit and receive electric signals, such as data. For example, the interface 1013 may comprise apparatus such as a serial advanced technology attachment (SATA), integrated drive electronics (IDE), a small computer system interface (SCSI), or a combination thereof. The non-volatile memory 1018 is connected to the interface 1013 through the controller 1015. The non-volatile memory 1018 may serve to store data received through the interface 1013. Even if power supplied to the SSD 1011 is interrupted, the non-volatile memory 1018 will retain the stored data.

The buffer memory 1019 may include a volatile memory device. The volatile memory device may be a dynamic random access memory (DRAM) and/or a static random access memory (SRAM). The buffer memory 1019 may thus operate at higher speed than the non-volatile memory device 1018.

The data processing speed of the interface 1013 may be higher than the operating speed of the non-volatile memory device 1018. In this case, the buffer memory 1019 may serve to temporarily store data. After data received through the interface 1013 is temporarily stored in the buffer memory 1019 under the operation of the controller 1015, the received data may be permanently stored in the non-volatile memory 1018 at a data write speed of the non-volatile memory 1018. Also, among the data stored in the non-volatile memory 1018, frequently used data may be previously read and temporarily stored in the buffer memory 1019. That is, the buffer memory 1019 may function to increase the effective operating speed and reduce the error rate of the SSD 1011.

The non-volatile memory 1018 includes a semiconductor device similar to one of the semiconductor devices described with reference to FIGS. 1 through 8 and fabricated as described with reference to FIGS. 9-50. In particular, the non-volatile memory 1018 includes the diode layer 57, the buffer layer 43, the variable resistance material 44, word lines, and the electrode layer 45. The variable resistance material 44 is electrically connected to the controller 1015 through the electrode layer 45 and the connection terminal T. Thus, the non-volatile memory device 1018 imparts excellent electrical properties to the SSD 1011.

Another example of an electronic system according to the inventive concept will now be described in detail with reference to FIG. 52.

The electronic system 2100 of this example includes a body 2110, an MP unit 2120, a power unit 2130, a function unit 2140, and a display controller unit 2150. The body 2110 may include a mother board comprising a printed circuit board (PCB). The MP unit 2120, the power unit 2130, the function unit 2140, and the display controller unit 2150 are mounted to the body 2110. The display unit 2160 may be disposed on the body 2110. For example, the display unit 2160 may be disposed on the surface of the body 2110, and display an image processed by the display controller unit 2150.

The power unit 2130 may serve to receive a predetermined voltage from an external battery (not shown), divide the voltage into voltages of certain voltage levels, and supply the voltages to the MP unit 2120, the function unit 2140, and the display controller unit 2150. The MP unit 2120 controls the function unit 2140 and the display unit 2160. The function unit 2140 provides the electronic system 2100 with various functions. For example, when the electronic system 2100 is a portable phone, the function unit 2140 may include several components capable of respectively outputting an image to the display unit 2160, outputting a voice to a speaker, and dialing or communicating with an external apparatus 2170. When the portable phone is provided with a camera, the function unit 2140 may include the image processor of the camera.

Furthermore, in applications in which the electronic system 2100 is connected to a memory card, the function unit 2140 may be a memory card controller. The function unit 2140 may transmit/receive signals to/from the external apparatus 2170 through a wired or wireless communication unit 2180. Furthermore, when the electronic system 2100 requires a universal serial bus (USB) to increase functionality, the function unit 2140 may serve as an interface controller.

At least one of the MP unit 2120 and the function unit 2140 comprises a semiconductor device according to the inventive concept, i.e., a non-volatile memory device having a diode layer 57, buffer layer 43, variable resistance material 44, word lines, and electrode layer 45.

According to the inventive concept as described above, variable resistance material and a diode layer are interposed between word lines and bit pillars, and a buffer layer is interposed between the bit pillars and a molding layer. The diode layer reduces leakage current. The buffer layer prevents the variable resistance material and/or the bit pillars from being damaged by an etching process used to form the word lines. As a result, a non-volatile memory device having excellent electrical properties can be realized.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device comprising:
a lower molding layer;
a horizontal interconnection line disposed on the lower molding layer;
an upper molding layer disposed on the horizontal interconnection line;
a pillar extending vertically through the upper molding layer, the horizontal interconnection line, and the lower molding layer;
a buffer layer interposed between the pillar and each of the lower and upper molding layers; and
variable resistance material and a diode layer interposed between the pillar and the horizontal interconnection line.

2. The device of claim 1, wherein the diode layer comprises a metal oxide and has a composition different from that of the variable resistance material.

3. The device of claim 1, wherein the diode layer covers sidewall surfaces and top and bottom surfaces of the horizontal interconnection line.

4. The device of claim 1, wherein the variable resistance material is interposed between the pillar and the buffer layer.

5. The device of claim 4, wherein the diode layer is interposed between the pillar and the variable resistance material.

6. The device of claim 4, wherein the diode layer is interposed between the variable resistance material and the buffer layer.

7. The device of claim 1, wherein a first segment of the buffer layer is interposed between the pillar and the lower molding layer, a second segment of the buffer layer is interposed between the pillar and the upper molding layer, and the diode layer is interposed between the first and second segments of the buffer layer.

8. The device of claim 7, wherein each of the first and second segments of the buffer layer comprises silicon, and the diode layer comprises a silicide layer contacting each of the first and second segments of the buffer layer.

9. The device of claim 1, wherein the buffer layer comprises silicon oxide or silicon.

* * * * *